United States Patent [19]
Saeki

[11] Patent Number: 6,094,076
[45] Date of Patent: Jul. 25, 2000

[54] METHOD AND APPARATUS FOR CONTROLLING CLOCK SIGNALS

[75] Inventor: Takanori Saeki, Tokyo, Japan

[73] Assignee: NEC Corporation, Tokyo, Japan

[21] Appl. No.: 09/097,050

[22] Filed: Jun. 15, 1998

[30] Foreign Application Priority Data

Jun. 13, 1997 [JP] Japan ................................ 9-157042

[51] Int. Cl.⁷ .................................................. H03B 19/00
[52] U.S. Cl. ........................................... 327/116; 327/119
[58] Field of Search .................................... 327/113, 116, 327/119, 120, 121, 122, 356; 377/47, 48

[56] References Cited

U.S. PATENT DOCUMENTS

| | | | |
|---|---|---|---|
| 3,826,901 | 7/1974 | Band et al. .............................. | 708/103 |
| 5,254,955 | 10/1993 | Saeki ........................................ | 331/34 |
| 5,422,835 | 6/1995 | Houle et al. ............................. | 708/103 |
| 5,514,990 | 5/1996 | Mukaine et al. ........................ | 327/116 |
| 5,530,387 | 6/1996 | Kim ......................................... | 327/119 |
| 5,544,203 | 8/1996 | Casasanta et al. ...................... | 375/376 |
| 5,548,249 | 8/1996 | Sumita et al. ........................... | 331/1 A |

FOREIGN PATENT DOCUMENTS 1-152815  6/1989  Japan .
7-321613  12/1995  Japan .

OTHER PUBLICATIONS

T. Shimizu et al., "A Multimedia 32b RISC Microprocessor with 16Mb DRAM", pp. 216–217, IEEE International Solid–State Circuits Conference, Feb. 9, 1996.

Chih–King Ken Yang et al., "A 0.8 μm CMOS 2.5GB/s Oversampled Receiver for Serial Links", pp. 200–201, IEEE International Solid–State Circuits Conference, 1996.

M. Combes, et al., "A Portable Clock Multiplier Generator Using Digital CMOS Standard Cells", pp. 958–965, IEEE Journal of Solid–State Circuits, vol. 31, No. 1, Jul. 1996.

*Primary Examiner*—Tuan T. Lam
*Attorney, Agent, or Firm*—Young & Thompson

[57] ABSTRACT

A clock signal control circuit includes a divider dividing an external clock signal into multiple phase clock signals, timing difference dividers connected to the divider for dividing a difference in phase of pulses between the multiple phase clock signals having different phases from each other to generate different phase clock signals, a single multiplexer connected to the timing difference dividers for multiplexing the different phase clock signals to generate multiplexed clock signals, and a synthesizer connected to the multiplexers for synthesizing the multiplexed clock signals into a single multiplied clock signal.

20 Claims, 14 Drawing Sheets

METHOD AND APPARATUS FOR CONTROLLING CLOCK SIGNALS

BACKGROUND OF THE INVENTION

The present invention relates in general to a method and an apparatus for controlling clock signals.

Conventional clock signal multiplier circuits are disclosed, for example, in ISSCC Digest of Technical Papers pp. 216–217, February 1996, and U.S. Pat. No. 5,422,835 and U.S. Pat. No. 5,530,837. A typical one of the conventional clock signal multiplier circuits is will be described with reference to FIG. 1. If four times multiplication of the clock signal required, a set of four delay circuits 301, 302, 303 and 304 are provided which are respectively connected to four switch circuits 305, 306, 307 and 308 so that each of the switch circuits 305, 306, 307 and 308 selects one of output terminals of corresponding one of the delay circuits 301, 302, 303 and 304. The four switch circuits 305, 306, 307 and 308 are respectively connected through the four switch circuits 305, 306, 307 and 308 to a single counter 310. The four sets of the delay circuit and the switch circuit ale connected in series to each other. A first clock signal 311 as an external clock signal is inputted into the first delay circuit 301. A second clock signal 312 is outputted from the first switch circuit 305 and inputted into the second delay circuit 302. A third clock signal 313 is outputted from the second switch circuit 306 and inputted into the third delay circuit 303. A fourth clock signal 314 is outputted from the third switch circuit 307 and inputted into the fourth delay circuit 304. A fifth clock signal 315 is outputted from the fourth switch circuit 308 and inputted into a phase comparator 309. The first clock signal is also inputted into the phase comparator 309. The phase comparator 309 receives the first and fifth clock signals 311 and 315 for phase comparison between the first and fifth clock signals 311 and 315. The phase comparator 309 outputs an UP-signal 316 or a DOWN-signal 317 on the basis of the result of the phase comparison between the first and fifth clock signals 311 and 315 and the UP-signal 316 or the DOWN-signal 317 is transmitted to the counter 310. The counter 310 outputs a control signal 318 on the basis of the UP-signal 316 or the DOWN-signal 317. The control signal 318 is transmitted to the four switch circuits 305, 306, 307 and 308 respectively. The control signal is such as to adjust the first and fifth clock signals 311 and 315 to be identical in phase to each other. Delay times of the four delay circuits 301, 302, 303 and 304 are adjusted to be equal to each other, for which reason individual differences in timing are made equal to each other between the first and second clock signals 311 and 312, between the second and third clock signals 312 and 313, and between the third and fourth clock signals 313 and 314. The difference in timing between adjacent two of the four sets of the delay circuit and the switch circuit corresponds to one quarter of a time period of the clock signal. The first clock signal 311, the second clock signal 312, the first clock signal 311 and the fourth clock signal are synthesized in order to obtain a four-time multiplied clock signal.

The clock signal multiplier circuit may comprise a phase lock loop circuit as illustrated in FIG. 2. The clock signal multiplier circuit has a voltage control signal generator 322 and a divider 323 connected to the voltage control signal generator 322 for receiving output signals from the voltage control signal generator 322 to divide the signal. The clock signal multiplier circuit further has a phase comparator 319 connected to the divider 323 for receiving the divided signal from the divider 323 and also receiving an external clock signal 324 in order to conduct a comparison in phase between the divided signal and the external clock signal 324. The phase comparator 319 outputs an UP-signal 325 or a DOWN-signal 326 on the basis of the result of the phase comparison. The clock signal multiplier circuit further has a charge pump circuit 320 connected to the phase comparator 319 for receiving the UP-signal 325 or the DOWN-signal 326 from the phase comparator 319, and a loop filter circuit 321 connected to the charge pump circuit 320 for receiving an output signal from the charge pump circuit 320. The above voltage control signal generator 322 is also connected to the loop filter circuit 321 for receiving an output signal from the loop filter circuit 321 whereby the voltage control signal generator 322 controls a voltage of the signal to be transmitted to the divider 323 on the basis of the received signal from the loop filter circuit 321 so that the divided clock signal is equal in frequency to the external clock signal 324. For this purpose, the voltage control signal generator 322generates a multiplied clock signal 327 which has an inverse multiple to the dividing number.

The first conventional clock signal multiplier circuit as illustrated in FIG. 1 has a disadvantage that it is necessary to make the phase comparison more than several tens of times between the external clock signal and the delayed clock signals supplied through the series connections of the four sets of the delay circuit and the switch circuit, wherein differences in delay and phase are gradually compensated in each comparison process and after the several tens of phase comparison processes have been executed, then it is possible to obtain the multiplied clock signal. This means it difficult for the first conventional clock signal multiplier circuit to exhibit high speed performance.

The second conventional clock signal multiplier circuit as illustrated in FIG. 2 also has a disadvantage that it is necessary to make the phase comparison more than several tens of times between the external clock signal 324 and the divided clock signals supplied through the divider, wherein differences in delay and phase are gradually compensated in each comparison process and after the several tens of phase comparison processes have been executed, then it is possible to obtain the multiplied clock signal. This means it difficult for the second conventional clock signal multiplier circuit to exhibit high speed performances.

For the above first and second conventional clock signal multiplier circuits, it takes a time corresponding to several tens of clocks signals to obtain the required multiplied clock signals.

Further, the above first and second conventional clock signal multiplier circuits are available to control the clock signals but inapplicable as a delay circuit varying signal delay time.

In the above circumstances, it had been required to develop a novel clock signal multiplier circuit free from the above problems.

SUMMARY OF THE INVENTION

Accordingly, it is an object of the present invention to provide a novel clock signal control circuit free from the above disadvantages.

It is a further object of the present invention to provide a novel clock signal control circuit which exhibits high speed performances.

It is a still further object of the present invention to provide a novel clock signal control circuit capable of obtaining multiplied clock signals in a short time.

It is yet a further object of the present invention to provide a novel clock signal control circuit which is available not only as a clock signal multiplier circuit but also as a variable delay circuit capable of varying delay time of the clock signal.

It is a further object of the present invention to provide a novel clock signal control method from the above disadvantages.

It is still another object of the present invention to provide a novel clock signal control method which allows a clock signal control circuit to exhibit high speed performance.

It is moreover an object of the present invention to provide a novel clock signal control method of obtaining multiplied clock signals in a short time.

It is another object of the present invention to provide a novel clock signal control method which allows a clock signal control circuit to be available not only as a clock signal multiplier circuit but also a variable delay circuit capable of varying delay time of the clock signal.

The present invention provides clock signal control circuitry comprising the following elements. A divider is provided for dividing an external clock signal into multiple phase clock signals. Timing difference dividers are provided which are connected to the divider for dividing a difference in phase of pulse between the multiple phase clock signals having different phases from each other to generate different phase clock signals. A single multiplexer is provided which is connected to the timing difference dividers for multiplexing the different phase clock signals to generate multiplexed clock signals. A synthesizer is provided which is connected to the multiplexers for synthesizing the multiplexed clock signals into a single multiplied clock signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
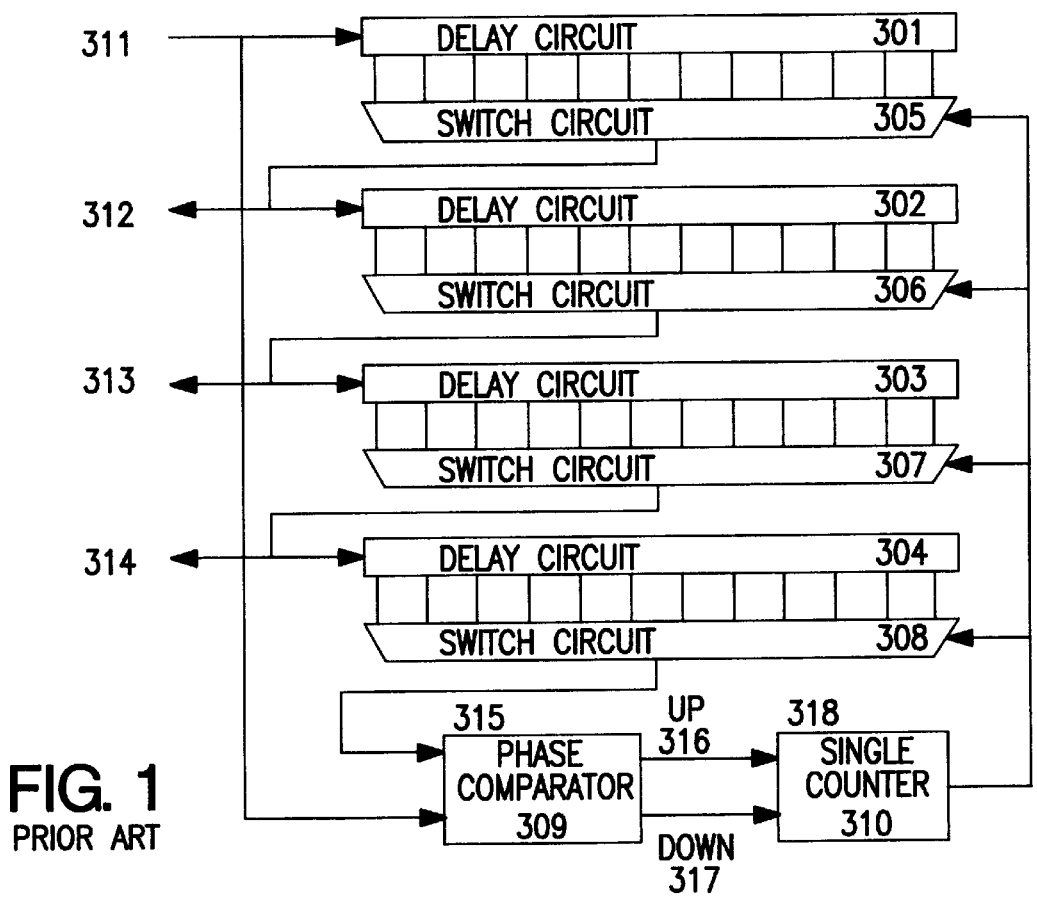
FIG. 1 is a schematic block diagram illustrative of the typical one of the conventional clock signal multiplier circuits.
Figure 2:
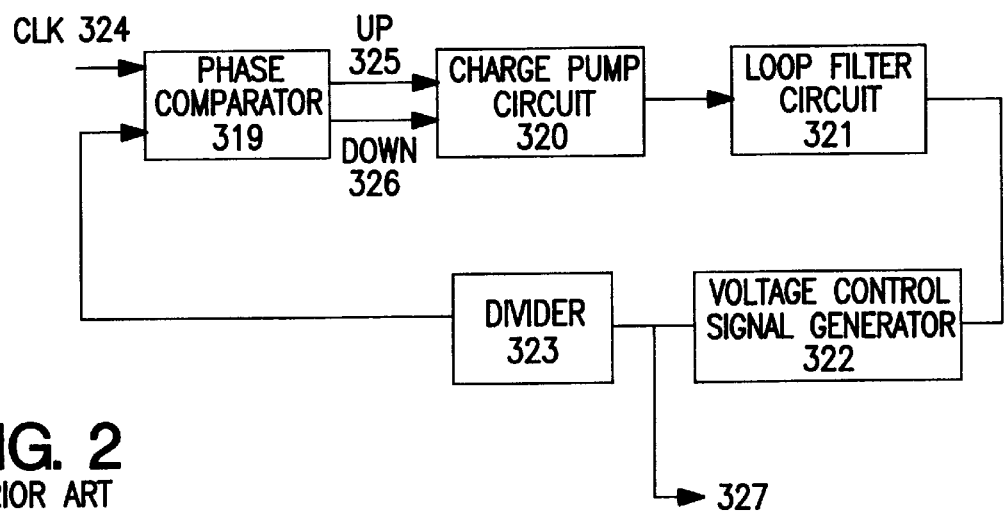
FIG. 2 is a schematic block diagram illustrative of the conventional phase lock loop circuit used in the conventional clock signal multiplier circuit.

The first aspect of the present invention provides a clock signal control circuit comprising the following elements. A divider is provided for dividing an external clock signal into multiple phase clock signals. Timing difference dividers are provided which are connected to the divider for dividing a difference in phase of pulse between the multiple phase clock signals having different phases from each other to generate different phase clock signals. A single multiplexer is provided which is connected to the timing difference dividers for multiplexing the different phase clock signals to generate multiplexed clock signals. A synthesizer is provided which is connected to the multiplexers for synthesizing the multiplexed clock signals into a single multiplied clock signal.

It is preferable that the divider comprises a ¼ divider for dividing the external clock signal into four-phase clock signals and wherein the timing difference divider comprises four timing difference dividers connected in parallel to each other and each of the four timing difference dividers is capable of generating a plurality of multiple phase clock signals.

It is further preferable that each of the four timing difference dividers comprises a plurality of timing difference dividers connected in parallel to each other and a single clock reset signal generator connected in parallel to the timing difference dividers and also connected to transmit a reset signal to each of the timing difference dividers so that individual timing difference dividers output different phase clock signals respectively.

It is also preferable that each of the four timing difference dividers comprises a plurality of timing difference dividers connected in parallel to each other and a logic gate circuitry connected to an input side of each of the timing difference dividers so that individual timing difference dividers output different phase clock signals respectively.

It is also preferable that the timing difference divider is connected to a period detection circuit for receiving a control signal from the period detection circuit.

It is also preferable that the timing difference dividers and the multiplexer are provided to form a multiple phase clock signal multiplier circuit connected in series between the divider and the synthesizer.

It is also preferable that the timing difference dividers include MOS field effect transistors and capacitors and the timing difference dividers are different from each other in gate width of the MOS field effect transistors and in capacitance of the capacitors.

The second aspect of the present invention provides a multiple phase clock signal multiplier comprising: a plurality of timing difference dividers for dividing a difference in phase of pulses between received multiple phase clock signals having different phases from each other to generate different phase clock signals; and a single multiplexer connected to the timing difference dividers for multiplexing the different phase clock signals to generate multiplexed clock signals.

It is preferable that the timing difference divider comprises four timing difference dividers connected in parallel to each other and the multiplexer comprises a single multiplexer connected in parallel to each other.

It is also preferable that each of the four timing difference dividers comprises a plurality of timing difference dividers connected in parallel to each other and a single clock reset signal generator connected in parallel to the timing difference dividers and also connected to transmit a reset signal to each of the timing difference dividers so that individual timing difference dividers output different phase clock signals respectively.

It is further preferable that each of the four timing difference dividers comprises a plurality of timing difference dividers connected in parallel to each other and a logic gate circuitry connected to an input side of each of the timing difference dividers so that individual timing difference dividers output different phase clock signals respectively.

It is also preferable that the timing difference divider is connected to a period detection circuit for receiving a control signal from the period detection circuit.

It is also preferable that the timing difference dividers and the multiplexers are provided to form a single multiple phase clock signal multiplier circuit.

It is also preferable that the timing difference dividers include MOS field effect transistors and capacitors and the timing difference dividers are different from each other in gate width of the MOS field effect transistors and in capacitance of the capacitors.

The third aspect of the present invention provides a clock signal control circuitry comprising: a divider for dividing an external clock signal into multiple phase clock signals; a single multiple phase clock signal multiplier circuit connected to the divider for receiving the multiple phase clock signals; and a synthesizer connected to the multiplexer for synthesizing the multiplexed clock signals into a single multiplied clock signal, wherein the multiple phase clock signal multiplier circuit comprising: a plurality of timing difference dividers connected in parallel to each other and also connected to the divider for dividing a difference in phase of pulses between the multiple phase clock signals having different phases from each other to generate different phase clock signals; and a single multiplexer connected to the timing difference dividers for multiplexing the different phase clock signals to generate multiplexed clock signals.

It is preferable that the divider comprises a ¼ divider for dividing the external clock signal into four-phase clock signals and wherein the timing difference divider comprises four timing difference dividers connected in parallel to each other and each of the four timing difference dividers is capable of generating a plurality of multiple phase clock signals.

It is also preferable that each of the four timing difference dividers comprises a plurality of timing difference dividers connected in parallel to each other and a single clock reset signal generator connected in parallel to the timing difference dividers and also connected to transmit a reset signal to each of the timing difference dividers so that individual timing difference dividers output different phase clock signals respectively.

It is also preferable that each of the four timing difference dividers comprises a plurality of timing difference dividers connected in parallel to each other and a logic gate circuitry connected to an input side of each of the timing difference dividers so that individual timing difference dividers output different phase clock signals respectively.

It is also preferable that the timing difference dividers are connected to a period detection circuit for receiving a control signal from the period detection circuit.

It is also preferable that the timing difference dividers in each of the multiple phase clock signal multiplier circuits include MOS field effect transistors and capacitors and the timing difference dividers are different from each other in gate width of the MOS field effect transistors and in capacitance of the capacitors.

The fourth aspect of the present invention provides a multiple phase clock signal multiplier comprising: a single multiple phase clock signal multiplier circuit, wherein the single multiple phase clock signal multiplier circuit further comprises: a plurality of timing difference dividers for dividing a difference in phase of pulse between received multiple phase clock signals having different phases from each other to generate different phase clock signals; and a single multiplexer connected to the timing difference dividers for multiplexing the different phase clock signals to generate multiplexed clock signals.

It is preferable that the timing difference divider comprises four timing difference dividers connected in parallel to each other and the multiplexer comprises a single multiplexer connected in parallel to each other.

It is also preferable that each of the four timing difference dividers comprises a plurality of timing difference dividers connected in parallel to each other and a single clock reset signal generator connected in parallel to the timing difference dividers and also connected to transmit a reset signal to each of the timing difference dividers so that individual timing difference dividers output different phase clock signals respectively.

It is also preferable that each of the four timing difference dividers comprises a plurality of timing difference dividers connected in parallel to each other and a logic gate circuitry connected to an input side of each of the timing difference dividers so that individual timing difference dividers output different phase clock signals respectively.

It is also preferable that the timing difference divider is connected to a period detection circuit for receiving a control signal from the period detection circuit.

It is also preferable that the timing difference dividers of each of the multiple phase clock signal multiplier circuits include MOS field effect transistors and capacitors and the timing difference dividers are different from each other in gate width of the MOS field effect transistors and in capacitance of the capacitors.

PREFERRED EMBODIMENTS
FIRST EMBODIMENT

Figure 3:
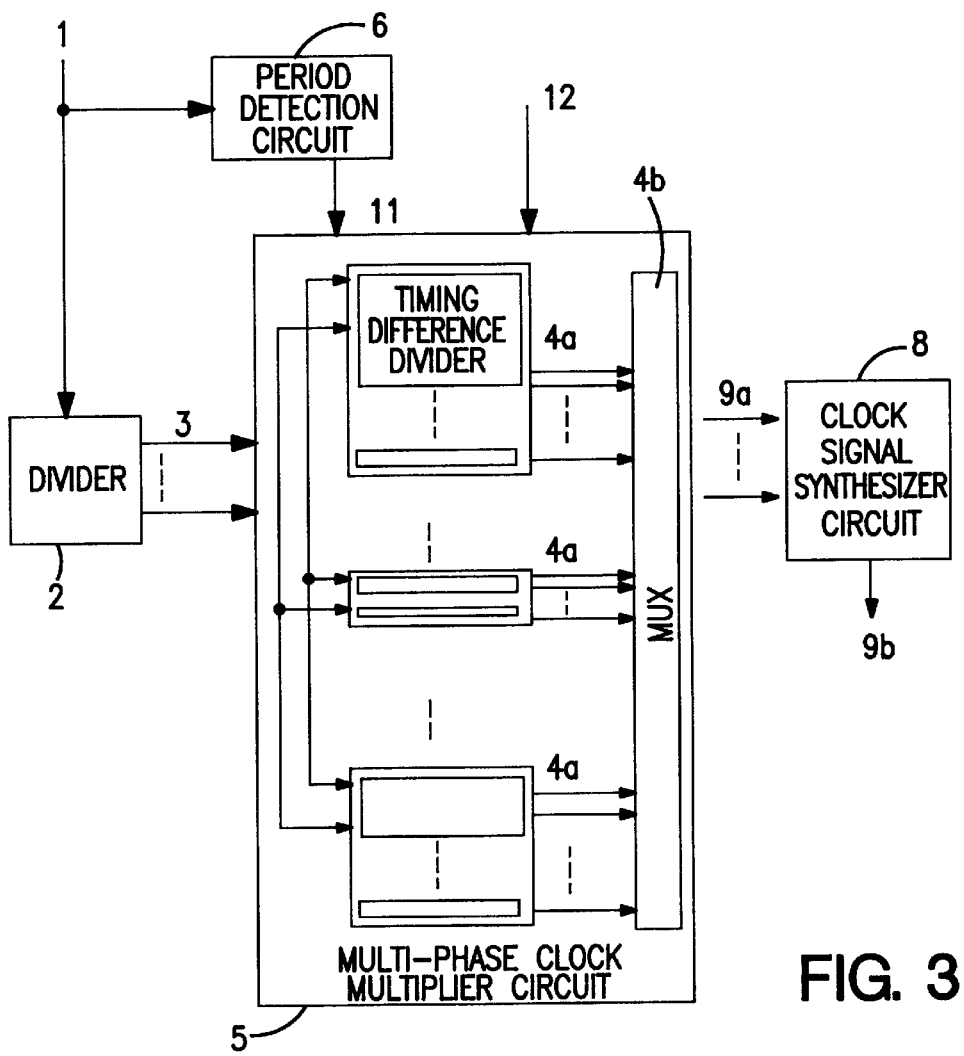
FIG. 3 is a schematic block diagram illustrative of a novel clock signal control circuit in accordance with the present invention.

A first embodiment according to the present invention will be described in detail with reference to the drawings. This embodiment provides a novel clock signal multiplier circuit for multiplying external clock signals as illustrated in FIG. 3, wherein an external clock signal 1 is first divided by a divider 2 into multi-phase or n-phase clock signals 3 so that a multi-phase clock signal multiplier circuit 5 divides differences in input timing of pulse edges of phase-differentiated multi-phase clock signals 3 from the divider 2 for subsequent multiplication of the divided different phase clock signals before those multiplex phase clock signals are then synthesized by a clock signal synthesizer circuit 8 to obtain a multiplied clock signal 9b.

Namely, the novel clock signal multiplier circuit comprises the divider 2, the multi-phase clock signal multiplier circuit 5 and the clock signal synthesizer circuit 8. The divider 2 is provided to divide the external clock signal 1 into the multi-phase clock signals 3. The multi-phase clock signal multiplier circuit 5 further has a plurality of timing difference dividers 4a, each of which is operated to divide different phase pulses of the different phase clock signals during the multi-phase clock signals 3 (phase-variation), a plurality of other timing difference dividers 4a, each of which is operated to divide the same phase pulses of the same phase clock signals during the multi-phase clock signals 3 (phase-fixing), and a multiplexer circuit 4b for multiplexing the divided different phase pulses to generate multi-phase clock signals. The clock signal synthesizer circuit 8 is provided to synthesize the multi-phase clock signals. The above plural timing difference dividers 4a are connected in parallel to each other between the divider 2 and the multiplexer circuit 4b.

With reference again to FIG. 3, the external clock signal 1 is first divided into the multi-phase clock signals 3 by the divider 2 so that the timing difference dividers 4a divide differences in input timing of pulse edges of phase-differentiated multi-phase clock signals 3 from the divider 2 for subsequent multiplexing of the divided different phase clock signals by the multiplexer circuit 4b before those multiplexed phase clock signals are then synthesized by the clock signal synthesizer circuit 8 to obtain the required multiplied clock signal 9b.

In the phase variation method, the external clock signal with a single phase and a frequency "A" is divided by the divider into the multiple phase clock signals Q1 - - - Qn with m-phases and a frequency A/m. Namely, the number of phases are multiplied by m-times and the frequency becomes A/m. The phase difference of the different phase pulses of the different phase clock signals are divided into a plural number "n", whereby the number of phase is m×n and the frequency is A/m. The clock signals are then multiplexed by the multiplexer whereby the phase number is n and the frequency is A. The multiplexed clock signals are synthesized by the synthesizer 8 to generate a single clock signal with a phase number of 1 and a frequency of A×n.

On the other hand, in the phase fixing method, the external clock signal with a single phase and a frequency "A" is divided by the divider into the multiple phase clock signals Q1 - - - On with m-phases and a frequency A/m. Namely, the number of phases are multiplied by m-times and the frequency becomes A/m. The phase difference of the different phase pulses of the different phase clock signals are divided into a plural number "n", whereby the number of phase is m×n and the frequency is A/m. The clock signals are then multiplexed by the multiplexer whereby the phase number is m and the frequency is (A/m)×n. The multiplexed clock signals are synthesized by the synthesizer 8 to generate a single clock signal with a phase number of 1 and a frequency of A×n.

In the other phase variation method, the external clock signal with a single phase and a frequency "A" is divided by the divider into the multiple phase clock signals Q1 - - - Qn with m-phases and a frequency A/m. Namely, the number of phases are multiplied by m-times and the frequency becomes A/m. The phase difference of the different phase pulses of the different phase clock signals are divided into a plural number "n", whereby the number of phase is m×n and the frequency is A/m. The clock signals are then multiplexed by the multiplexer whereby the phase number is 2m and the frequency is (A/m)×(n/2). The multiplexed clock signals are synthesized by the synthesizer 8 to generate a single clock signal with a phase number of 2 and a frequency of A×(n/2).

The novel clock signal multiplier circuit of the first embodiment in accordance with the present invention will further be described in more detail with reference to FIG. 4, wherein an external clock signal 1 is divided into four different phase clock signals for subsequent synthesizing the two different phase clock signals to obtain a multiplied clock signal. A ¼ divider 2 is operated to divide the external clock signal 1 into four different phase clock signals Q1, Q2, Q3 and Q4. A four-phase clock signal multiplier circuit 5 is connected between the ¼ divider 2 and a clock signal synthesizer circuit 8 for n-dividing differences in input timing of the pulse edges with n-different phases of the multi-phase clock signals divided by the divider 2. The four-phase clock signal multiplier circuit 5 conducts a n-times multiplication of the four different phase clock signals Q1, Q2, Q3 and Q4 to generate n-times multiplied different phase clock signals S1, S2, S3, S4 - - - Snmax. The clock signal synthesizer circuit 8 receives the n-times multiplied different phase clock signals S1, S2, S3, S4 - - - Snmax and synthesizes the n-times multiplied different phase clock signals S1, S2, S3, S4 - - - Snmax into a single multiplied clock signal 9b.

Further, a period detection circuit 6 is provided for receiving the external clock signal 1 to generate a control signal 7 to be supplied to the four-phase clock signal multiplier circuit 5 so as to compensate clock signal period dependency of the timing difference dividers included in the four-phase clock signal multiplier circuit 5. The period detection circuit 6 of this embodiment has a predetermined number of stages on each of which a ring-oscillator and a counter are provided, so that the counter is operated to count the number of oscillations of the ring oscillator during one period of the external clock signal 1 for generating the control signal 7 on the basis of the counted number. As a result, the control signal 7 from the period detection circuit 6 settles a problem with variation in characteristics of the four-phase clock signal multiplier circuit 5.

As a modification to the period detection circuit 6, the period detection circuit 6 may comprise invertors and latch circuits which have a cascade connection.

Further, a multiplying number determination code 12 is externally inputted into the four-phase clock signal multiplier circuit 5 in order to determine the maximum number of the clock signals to be synthesized by the clock signal synthesizer 8 and allow the remaining clock signals to be removed by the clock signal synthesizer 8.

Figure 4:
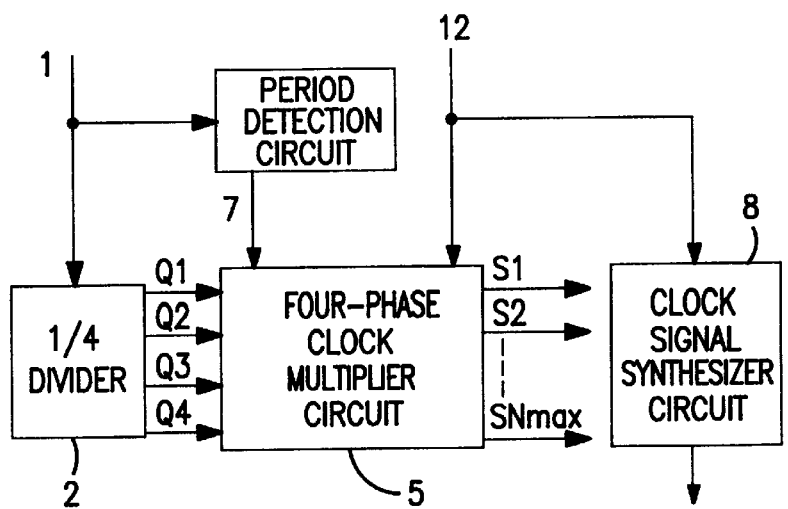
FIG. 4 is a schematic block diagram illustrative of a novel clock signal control circuit using a ¼ divider in a first embodiment in accordance with the present invention.
Figure 5:
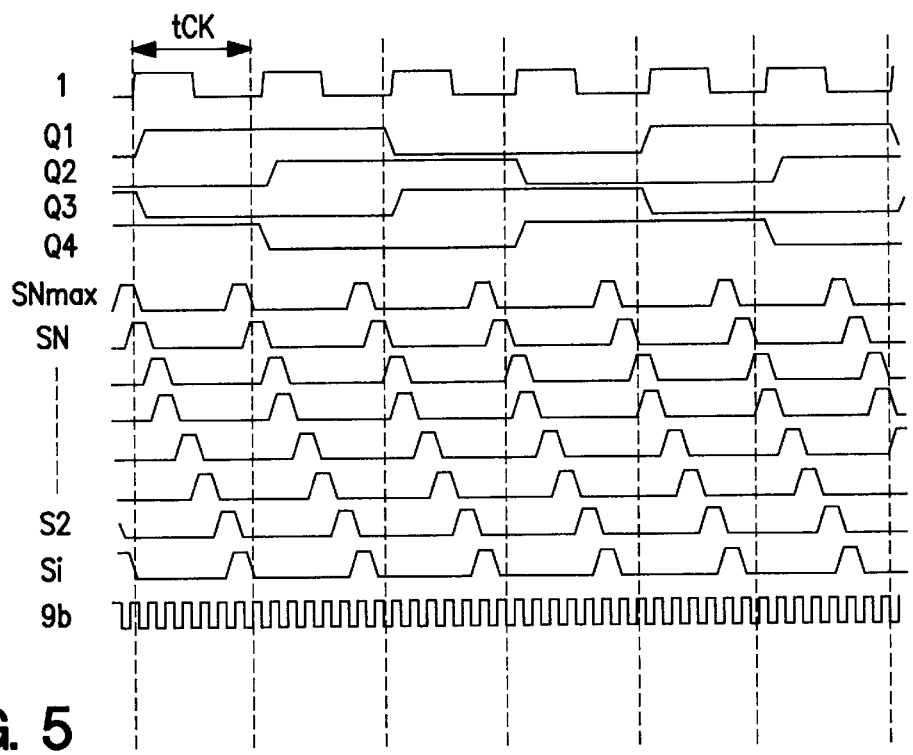
FIG. 5 is a timing chart illustrative of waveforms of the four-phase clock signals and a multiplied clock signal in relation to the novel clock signal control circuit of FIG. 4.

FIG. 5 is a timing chart illustrative of waveforms of the four-phase clock signals and a multiplied clock signal in relation to the novel clock signal control circuit of FIG. 4. The external clock signal 1 is divided by the divider 2 into the four different phase clock signals Q1, Q2, Q3 and Q4. The four different phase clock signals Q1, Q2, Q3 and Q4 are multiplied by the four-phase clock signal multiplier circuit 5 to generate n-times multiplied different phase clock signals S1, S2, S3, S4 - - - Snmax. The four-phase clock signal multiplier circuit 5 receives a multiplying number determination code 12 so that if the multiplying number determination code 12 designates the number "n", then only the clock signals S1, S2, - - - Sn are used as n-phase clock signals within the period of tCK with a phase difference of tCK/n and then synthesized by the clock signal synthesizer 8 to generate the multiplied clock signal 9b, whilst the remaining clock signals Sn+1 - - - Snmax are removed by the clock signal synthesizer 8. "nmax" indicates the maximum value by which the four-phase clock signals Q1, Q2, Q3 and Q4 are multiplied by the four-phase clock signal multiplier circuit 5. In this embodiment, "nmax" is set to be 8.

Figure 6:
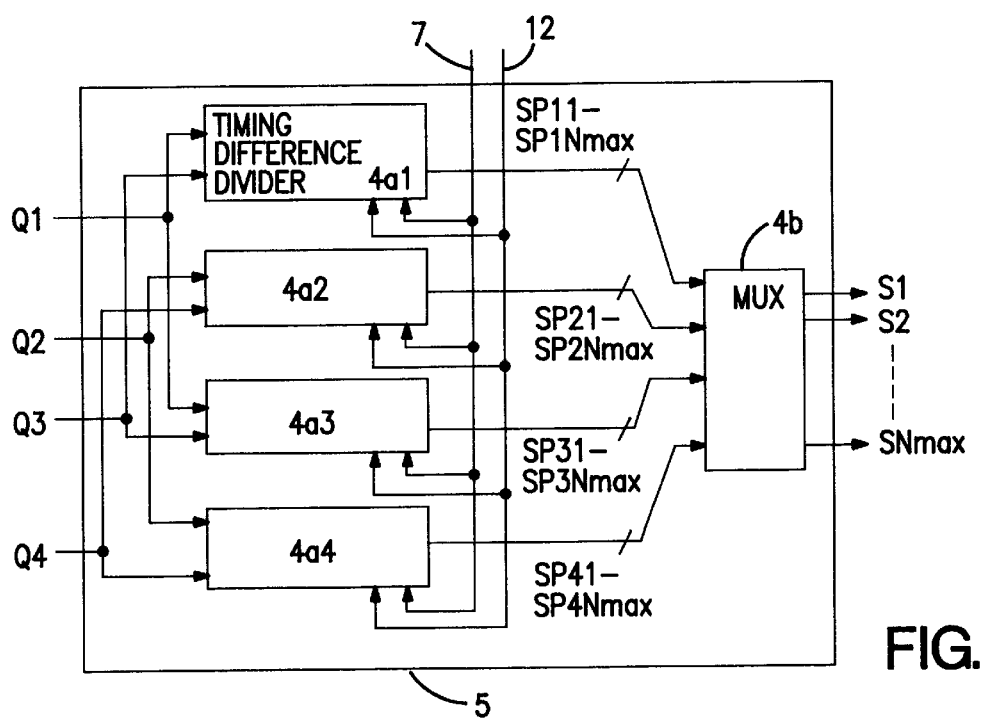
FIG. 6 is a schematic block diagram illustrative of each of the individual four-phase clock signal multiplier circuits in FIG. 4.

FIG. 6 is a schematic block diagram illustrative of each of the individual four-phase clock signal multiplier circuits in FIG. 4. The individual four-phase clock signal multiplier circuit of FIG. 6 is to be used in case of ¼ division=4, namely in case when a single four-phase clock signal multiplier circuit is connected in series between the ¼ divider and the multiplexer. The four-phase clock signal multiplier circuit 5 has four timing difference dividers 4a1, 4a2, 4a3 and 4a4 connected in parallel to each other and a single multiplexer circuit 4b. The multiplexer circuit 4b is connected to the four-phase clock signal multiplier circuit 5. Each of the four timing difference dividers 4a1, 4a2, 4a3 and 4a4 receives the control signal 7 and the multiplying number determination code 12. The timing difference divider 4a1 receives clock signals Q1 and Q3 to generate clock signals SP11 - - - SP1nmax. The timing difference divider 4a2 receives clock signals Q2 and Q4 to generate clock signals SP21 - - - SP2nmax. The timing difference divider 4a3 receives clock signals Q3 and Q1 to generate clock signals SP31 - - - SP3nmax. The timing difference divider 4a4 receives clock signals Q4 and Q2 to generate clock signals SP41 - - - SP4nmax The multiplexer circuit 4b receives the clock signals SP11 - - - SP1nmax from the timing difference divider 4a1. The multiplexer circuit 4b also receives the clock signals SP21 - - - SP2nmax from the timing difference divider 4a2. The multiplexer circuit 4b also receives the clock signals SP31 - - - SP3nmax from the timing difference divider 4a3. The multiplexer circuit 4b also receives the clock signals SP41 - - - SP4nmax from the timing difference divider 4a4. The clock signals SP11 - - - SP1nmax, the clock signals SP21 - - - SP2nmax, the clock signals SP31 - - - SP3nmax and the clock signals SP41 - - - SP4nmax are inputted into the single multiplexer 4b and then multiplexed thereby to generate nmax sets of the clock signals S1, S2, - - - Snmax. The clock signals S1, S2, - - - Snmax are inputted into the clock signal synthesizer 8. The multiplying number determination code 12 is inputted into the four timing difference dividers 4a1, 4a2, 4a3 and 4a4. If the multiplying number determination code 12 designates the number "n", then only the clock signals clock signals S1, S2, - - - Sn are used as n-phase clock signals within the period of tCK with a phase difference of tCK/n and then synthesized by the clock signal synthesizer 8 to generate the multiplied clock signal 9b, whilst the remaining clock signals clock signals Sn+1, - - - Snmax are removed by the clock signal synthesizer 8.

Figure 7:
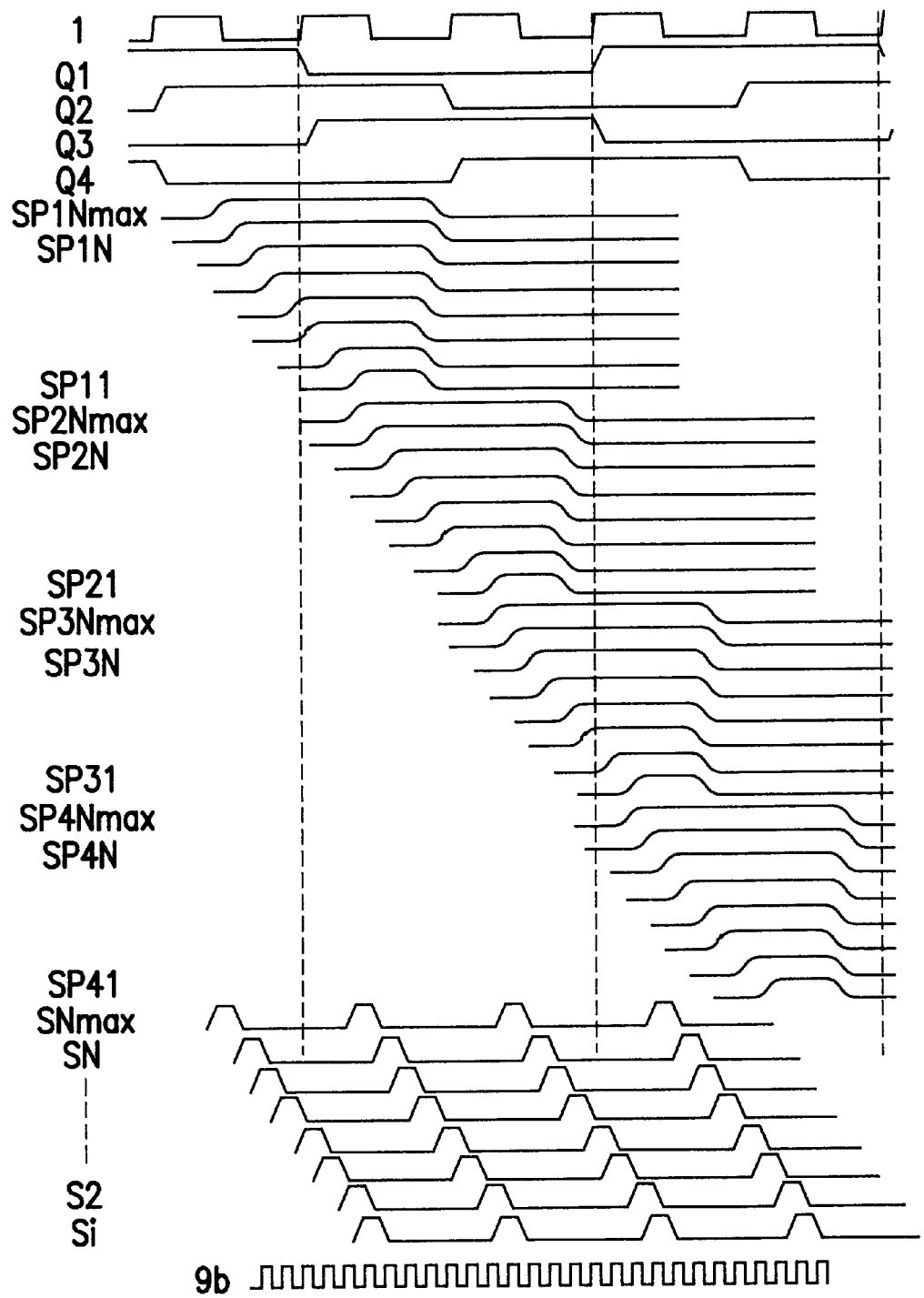
FIG. 7 is a timing chart illustrative of waveforms of the four-phase clock signals and a multiplied clock signal in relation to the clock signal multiplier circuit in FIG. 6.

FIG. 7 is a timing chart illustrative of waveforms of the four-phase clock signals and a multiplied clock signal in relation to the clock signal multiplier circuit in FIG. 6. The external clock signal 1 is divided by the ¼ divider 2 into four-phase clock signals Q1, Q2, Q3 and Q4. The lock signals Q1 and Q3 are inputted into the timing difference divider 4a1 to generate clock signals SP11 - - - SP1nmax. The clock signals Q2 and Q4 are inputted into the timing difference divider 4a2 to generate clock signals SP21 - - - SP2nmax. The clock signals Q3 and Q1 are inputted into the timing difference divider 4a3 to generate clock signals SP31 - - - SP3nmax. The clock signals Q4 and Q2 are inputted into the timing difference divider 4a4 to generate clock signals SP41 - - - SP4nmax. The clock signals SP11 - - - SP1nmax, SP21 - - - SP2nma, SP31 - - - SP3nmax, and SP41 - - - SP4nmax are inputted into the multiplexer circuit 4b to generate "nmax" sets of the clock signals S1, S2, - - - Snmax. The clock signals S1, S2, - - - Snmax are inputted into the clock signal synthesizer 8. The multiplying number determination code 12 has also been inputted into the four timing difference dividers 4a1, 4a2, 4a3 and 4a4. If the multiplying number determination code 12 designates the number "n", then only the clock signals clock signals S1, S2, - - - Sn are used as n-phase clock signals within the period of tCK with a phase difference of tCK/n and then synthesized by the clock signal synthesizer 8 to generate the multiplied clock signal 9b, whilst the remaining clock signals clock signals Sn+1, - - - Snmax are removed by the clock signal synthesizer 8.

Figure 8:
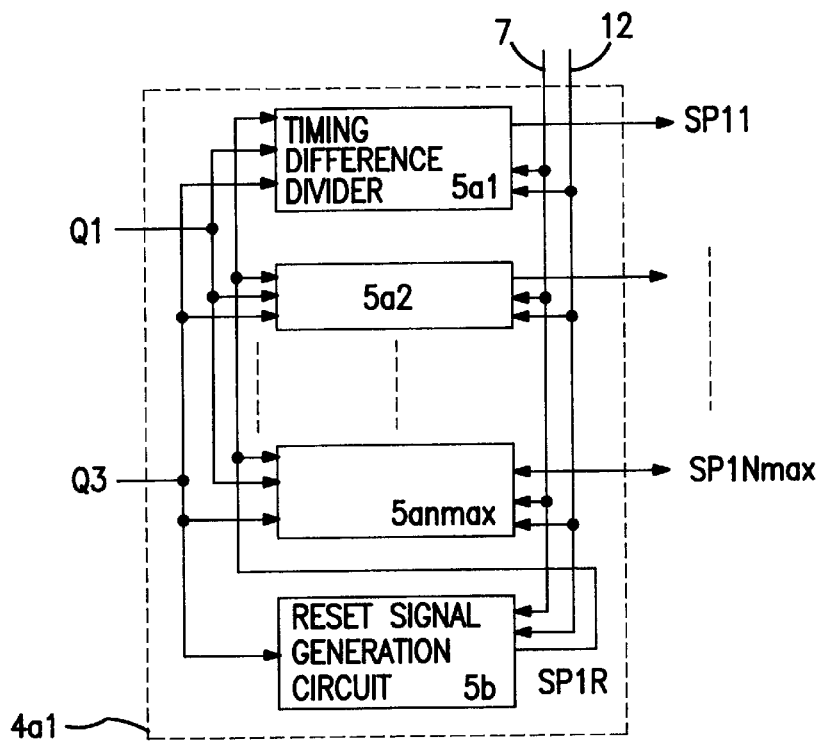
FIG. 8 is a circuit diagram illustrative of the timing difference divider 4a1 in the four-phase clock signal multiplier circuit of FIG. 6.

FIG. 8 is a circuit diagram illustrative of the timing difference divider 4a1 in the four-phase clock signal multiplier circuit of FIG. 6. The timing difference divider 4a1 comprises four timing difference dividers 5a, 5a2, 5a3 and 5a4 and a reset signal generation circuit 5b. The four timing difference dividers 5a1, 5a2, 5a3 and 5a4 and the single reset signal generation circuit 5b are connected in parallel to each other between the ¼ divider 2 and the multiplexer 8. The control signal 7 and the multiplying number determination code 12 are inputted into each of the four timing difference dividers 5a1, 5a2. 5a3 and 5a4 and the single reset signal generation circuit 5b. The clock signal Q1 from the ¼ divider 2 is inputted into each of the four timing difference dividers 5a1, 5a2, 5a3 and 5a4 whilst the clock signal Q2 from the ¼ divider 2 is inputted into not only each of the four timing difference dividers 5a1, 5a2, 5a3 and 5a4 but also the single reset signal generation circuit 5b. The single reset signal generation circuit 5b is operated to generate a reset signal on the basis of the clock signal Q3 as well as the control signal 7 and the multiplying number determination code 12 so that the reset signal is transmitted into each of the four timing difference dividers 5a1, 5a2, 5a3 and 5a4.

Figure 9:
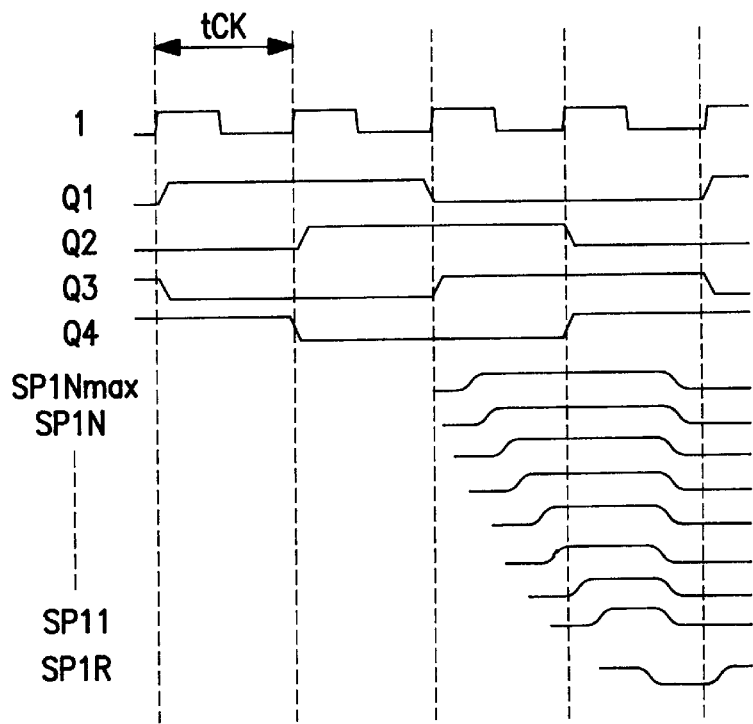
FIG. 9 is a timing chart illustrative of waveforms of the clock signals of the timing difference divider 4a1 of FIG. 8.

FIG. 9 is a timing chart illustrative of waveforms of the clock signals of the timing difference divider 4a1 of FIG. 8. The descriptions will be described in case of "n"=7 and "nmax"=8 The multiplying number determination code designates "n"=7. The clock signals SP11 - - - SP17 differ in rising edge timing from each other by tCK/7. The rising edges appear on the clock signals SP11 - - - SP17 with phase difference corresponding to tCK/7. When the falling appears on the reset signal S1R, then the clock signals SP11 - - - SP17 are fallen. The clock signals SP17, SP16, SP15, SP14, SP13, SP12 and SP11 are sequentially outputted. The falling of the clock reset signal S1R appears about tCK/7 after the clock signal SP11 has been risen. On the other hands, the clock signal SP18 is fixed at low level by the clock signal synthesizer circuit 8 using the normal decoder circuit.

Figure 10:
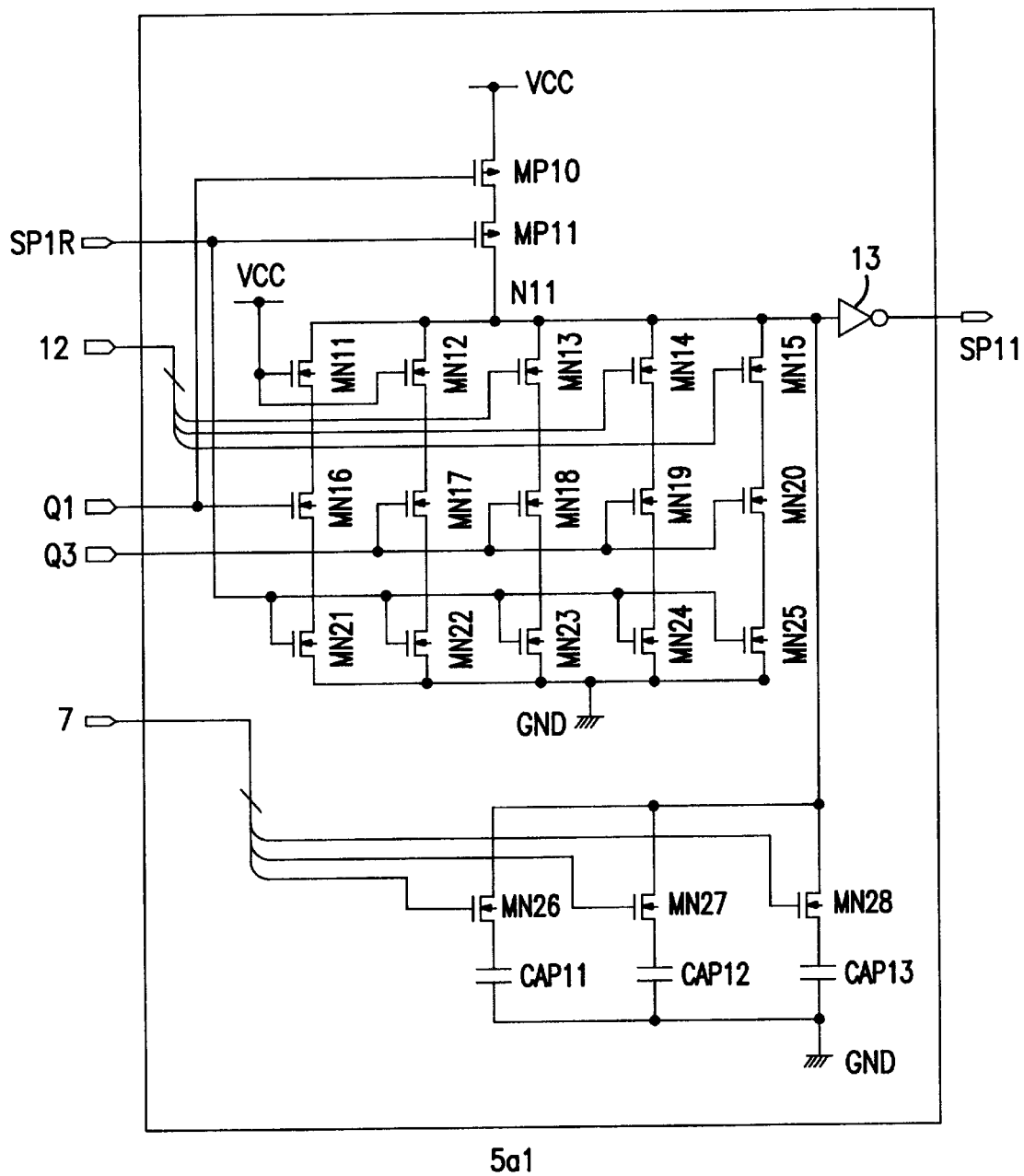
FIG. 10 is a circuit diagram illustrative of the timing difference divider 5a1 in the timing difference divider 4a1 of FIG. 8.

FIG. 10 is a circuit diagram illustrative of the timing difference divider 5a1 in the timing difference divider 4a1 of FIG. 8. The four timing difference dividers 5a1, 5a2. 5a3 and 5a4 have the same elements, for example, a single invertor 13, a set of two p-channel MOS field effect transistors MP10 and MP11, a first set of three n-channel MOS field effect transistors MN11, MN16 and MN21 connected in series to each other, a second set of three n-channel MOS field effect transistors MN12, MN17 and MN22 connected in series to each other, a third set of three n-channel MOS field effect transistors MN13, MN18 and MN23 connected in series to each other, a fourth set of three n-channel MOS field effect transistors MN14, MN19 and MN24 connected in series to each other, a fifth set of three n-channel MOS field effect transistors MN15, MN20 and MN25 connected in series to each other, a sixth set of an n-channel MOS field effect transistor MN26 and a capacitor CAP11 connected in series to each other, a seventh set of an n-channel MOS field effect transistor MN27 and a capacitor CAP12 connected in series to each other, and an eight set of an n-channel MOS field effect transistor MN28 and a capacitor CAP13 connected in series to each other.

The single invertor 13 is connected between a common node N11 and an output terminal from which the clock signal SP11 is outputted. The series connection of the two p-channel MOS field effect transistors MP10 and MP11 is connected between a high voltage line VCC and the common node N1. A first series connection of the three n-channel MOS field effect transistors MM11, MN16 and MN21 is connected between the common node N11 and a ground line GND. A second series connection of the three n-channel MOS field effect transistors MN12, MN17 and MN22 is also connected between the common node N11 and a ground line GND. A third series connection of the three n-channel MOS field effect transistors MN13, MN18 and MN23 is also connected between the common node N11 and a ground line GND. A fourth series connection of the three n-channel MOS field effect transistors MN14, MN19 and MN24 is also connected between the common node N11 and a ground line GND. A fifth series connection of the three n-channel MOS field effect transistors MN15, MN20 and MN25 is also connected between the common node N11 and a ground line GND. A sixth series connection of the n-channel MOS field effect transistor MN26 and the capacitor CAP11 is connected between the common node N11 and a ground line GND. A seventh series connection of the n-channel MOS field effect transistor MN27 and the capacitor CAP12 is also connected between the common node N11 and a ground line GND. An eight series connection of the n-channel MOS field effect transistor MN28 and the capacitor CAP13 is also connected between the common node N11 and a ground line GND. A gate of the p-channel MOS field effect transistor MP10 receives the clock signal Q1. A gate of the p-channel MOS field effect transistor MP11 is connected to the reset signal generation circuit 5b for receiving the reset signal SP1R. Gates of the n-channel MOS field effect transistors MN11 and MN12 are connected to the high voltage line VCC for receiving the high voltage. Gates of the n-channel MOS field effect transistors MN13, MN14 and MN15 receive the multiplying number determination code 12. A gate of the n-channel MOS field effect transistor MN16 receives the clock signal Q1. Gates of the n-channel MOS field effect transistors MN17, MN18, MN19 and MN20 receive the clock signal Q3. Gates of the n-channel MOS field effect transistors MN21, MN22, MN23, MN24 and MN25 receive the reset signal SP1R. Gates of the n-channel MOS field effect transistors MN26, MN27 and MN28 receive the control signal 7 from the counter. Loads to the common node N11 comprises the sixth series connection of the n-channel MOS field effect transistor MN26 and the capacitor CAP11, the seventh series connection of the n-channel MOS field effect transistor MN27 and the capacitor CAP12, the eight series connection of the n-channel MOS field effect transistor MN28 and the capacitor CAP13. The n-channel MOS field effect transistors MN11, MN12, MN13, MN14 and MN15 have size ratios in gate width of 1:2:2:4. The n-channel MOS field effect transistors MN16, MN17, MN18, MN19 and MN20 have size ratios in gate width of 1:2:2:4. The n-channel MOS field effect transistors MN21, MN22, MN23, MN24 and MN25 have size ratios in gate width of 1:2:2:4. The sixth set of the n-channel MOS field effect transistor MN26 and the capacitor CAP11, the seventh set of the n-channel MOS field effect transistor MN27 and the capacitor CAP12, and the eighth set of the n-channel MOS field effect transistor MN28 and the capacitor CAP13 have size ratios in gate width and capacitance of 1:2:4.

The n-channel MOS field effect transistors MN13, MN14 and MN15 show ON/OFF switching operations in accordance with input data of the multiplying number determination code 12. On the other hand, the n-channel MOS field effect transistor MN12 is always in ON-state. A sum of the gate widths of ones in ON-state of the n-channel MOS field effect transistors MN13, MN14 and MN15 and the gate width of the n-channel MOS field effect transistor MN12 is wider by two times than the designated number "n" by the multiplying number determination code 12. If n=7, then the n-channel MOS field effect transistor MN13 only turns OFF, whereby The sum of the gate widths of the n-channel MOS field effect transistors is 2+4+8=14. Consequently, the sum of the gate widths of the n-channel MOS field effect transistors in ON-state when the clock signal Q2 is high level is 2n where "n" is the designated number by the multiplying number determination code 12.

The n-channel MOS field effect transistors MN26, MN27 and MN28 show ON/OFF switching operations in accordance with the control signal 7. Further, the sixth set of the n-channel MOS field effect transistor MN26 and the capacitor CAP11, the seventh set of the n-channel MOS field effect transistor MN27 and the capacitor CAP12, and the eighth set of the n-channel MOS field effect transistor MN28 and the capacitor CAP13 have size ratios in gate width and capacitance of 1:2:4. For those reasons, the loads to the common node N11 is varied at eight levels in accordance with the control signal 7.

Figure 11:
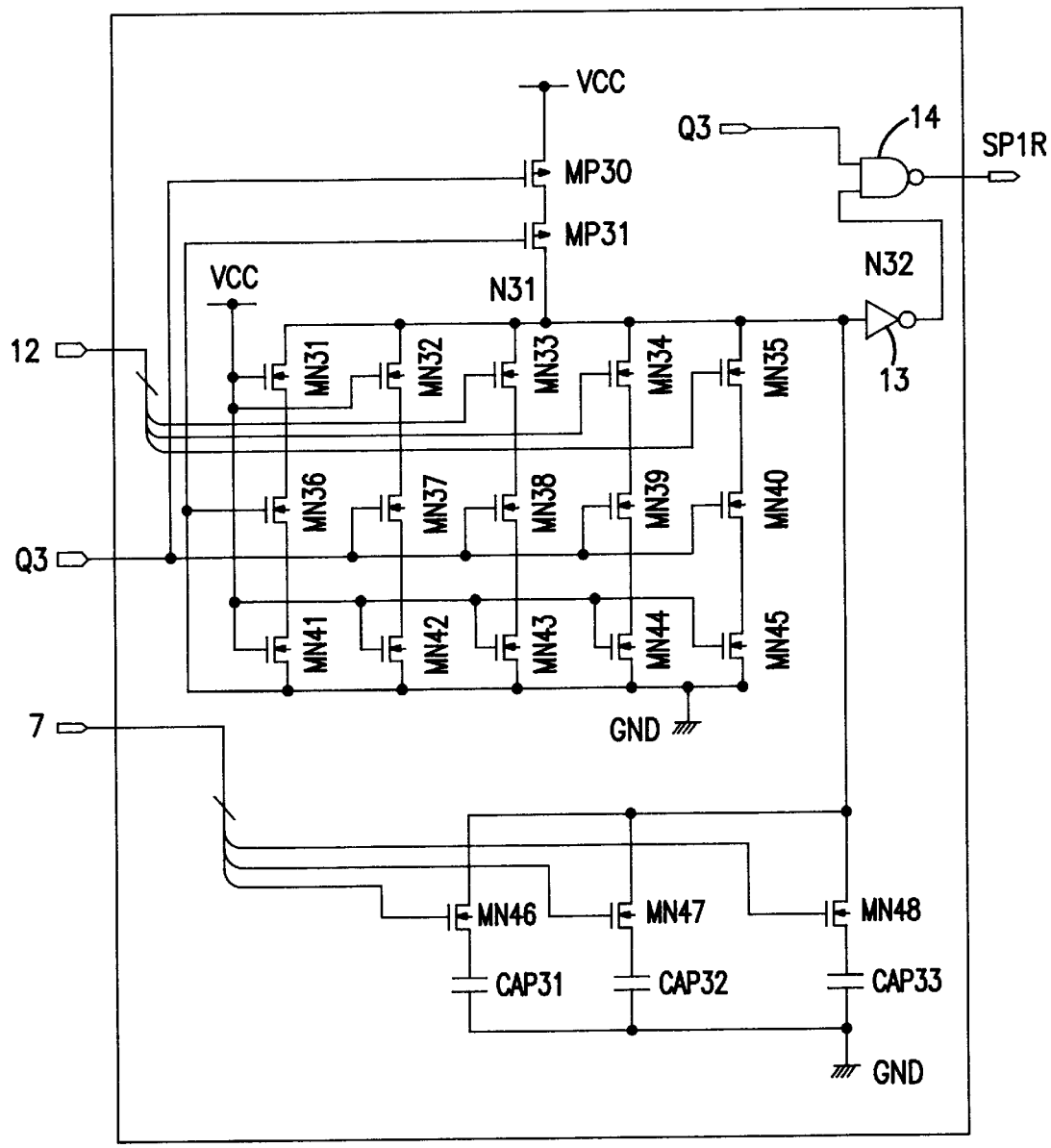
FIG. 11 is a circuit diagram illustrative of the clock reset signal generation circuit 5b in the timing difference divider 4a1 of FIG. 8.

FIG. 11 is a circuit diagram illustrative of the clock reset signal generation circuit 5b in the timing difference divider 4a1 of FIG. 8. The clock reset signal generation circuit 5b comprises a single invertor 33, a single NAND gate 14, a set of two p-channel MOS field effect transistors MP30 and MP31, a first set of three n-channel MOS field effect transistors MN31, MN36 and MN41 connected in series to each other, a second set of three n-channel MOS field effect transistors MN32, MN37 and MN42 connected in series to each other, a third set of three n-channel MOS field effect transistors MN33, MN38 and MN43 connected in series to each other, a fourth set of three n-channel MOS field effect transistors MN34, MN39 and MN44 connected in series to each other, a fifth set of three n-channel MOS field effect transistors MN35, MN40 and MN45 connected in series to each other, a sixth set of an n-channel MOS field effect transistor MN46 and a capacitor CAP31 connected in series to each other, a seventh set of an n-channel MOS field effect transistor MN47 and a capacitor CAP32 connected in series to each other, and an eight set of an n-channel MOS field effect transistor MN48 and a capacitor CAP33 connected in series to each other.

The two-input NAND gate 14 has two inputs receiving the clock signal Q3 and an output signal from the invertor 13. The single invertor 13 is connected between a common node N31 and the two-input NAND gate 14. The series connection of the two p-channel MOS field effect transistors MP30 and MP31 is connected between a high voltage line VCC and the common node N31. A first series connection of the three n-channel MOS field effect transistors MN31, MN36 and MN41 is connected between the common node N31 and a ground line GND. A second series connection of the three n-channel MOS field effect transistors MN32, MN37 and MN42 is also connected between the common node N31 and a ground line GND. A third series connection of the three n-channel MOS field effect transistors MN33, MN38 and MN43 is also connected between the common node N31 and a ground line GND. A fourth series connection of the three n-channel MOS field effect transistors MN34, MN39 and MN44 is also connected between the common node N31 and a ground line GND. A fifth series connection of the three n-channel MOS field effect transistors MN35, MN40 and MN45 is also connected between the common node N31 and a ground line GND. A sixth series connection of the n-channel MOS field effect transistor MN46 and the capacitor CAP31 is connected between the common node N31 and a ground line GND. A seventh series connection of the n-channel MOS field effect transistor MN47 and the capacitor CAP32 is also connected between the common node N31 and a ground line GND. An eight series connection of the n-channel MOS field effect transistor MN48 and the capacitor CAP33 is also connected between the common node N31 and a ground line GND. A gate of the p-channel MOS field effect transistor MP30 receives the clock signal Q3. A gate of the p-channel MOS field effect transistor MP31 is connected to the ground line GND for receiving the ground voltage. Gates of the n-channel MOS field effect transistors MN31 and MN32 are connected to the high voltage line VCC for receiving the high voltage. Gates of the n-channel MOS field effect transistors MN33, MN34 and MN35 receive the multiplying number determination code 12. A gate of the n-channel MOS field effect transistor MN36 is connected to the ground line GND for receiving the ground voltage. Gates of the n-channel MOS field effect transistors MN37, MN38, MN39 and MN40 receive the clock signal Q3. Gates of the n-channel MOS field effect transistors MN41, MN42, MN43, MN44 and MN45 is connected to the high voltage line VCC for receiving the high voltage. Gates of the n-channel MOS field effect transistors MN46. MN47 and MN48 receive the control signal 7 from the counter. Loads to the common node N31 comprises the sixth series connection of the n-channel MOS field effect transistor MN46 and the capacitor CAP31, the seventh series connection of the n-channel MOS field effect transistor MN47 and the capacitor CAP32, and the eight series connection of the n-channel MOS field effect transistor MN48 and the capacitor CAP33. The n-channel MOS field effect transistors MN31, MN32, MN33, MN34 and MN35 have size ratios in gate width of 1:2:2:4. The n-channel MOS field effect transistors MN36, MN37, MN38, MN39 and MN40 have size ratios in gate width of 1:2:2:4. The n-channel MOS field effect transistors MN41, MN42, MN43, MN44 and MN45 have size ratios in gate width of 1:2:2:4. The sixth set of the n-channel MOS field effect transistor MN46 and the capacitor CAP31, the seventh set of the n-channel MOS field effect transistor MN47 and the capacitor CAP32, and the eighth set of the n-channel MOS field effect transistor MN48 and the capacitor CAP33 have size ratios in gate width and capacitance of 1:2:4.

Figure 12:
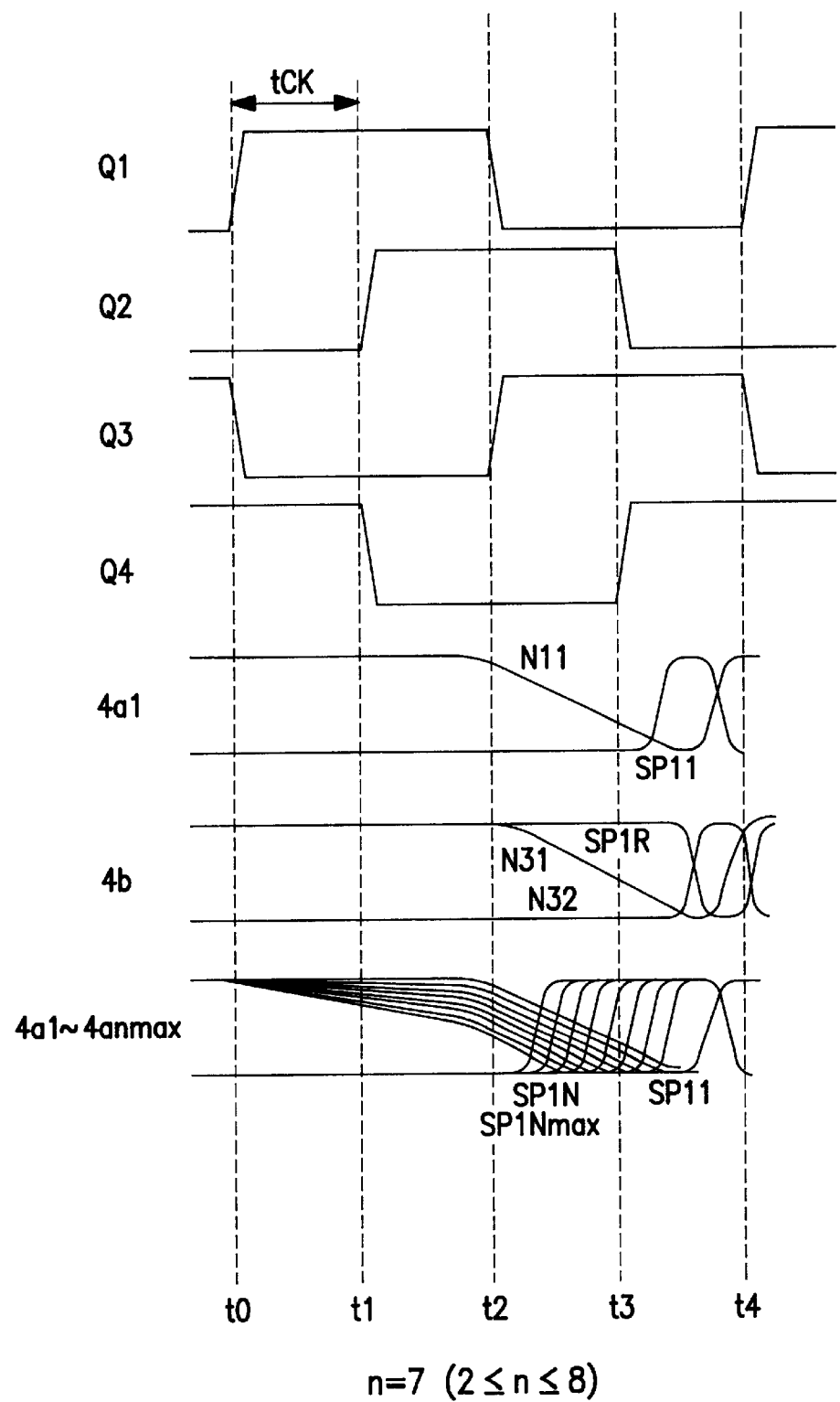
FIG. 12 which is a timing chart illustrative of waveforms of signals at the two nodes of the timing difference dividers and the reset signal generator circuit of FIGS. 10 and 11.

Operations of the timing difference dividers $5a1$, $5a2$, $5a3$, and $5a4$ and the reset signal generator circuit $5b$ will subsequently be described with reference to FIG. 12 which is a timing chart illustrative of waveforms of signals at the two nodes of the timing difference dividers and the reset signal generator circuit of FIGS. 10 and 11.

The waveforms of the signals at the common node N51 of the timing difference divider $5a1$ of FIG. 10 have a period ranged from t0 to t4, or 4tCK. The description will focus on rising of the clock signal at the common node N11. The rise-timing of the clock signal SP11 from the timing difference divider $5a$ will be described. When the n-channel MOS field effect transistors MN11 - - - MN25 turn ON, the charge at the node N11 is drawn through the n-channel MOS field effect transistors MN11 - - - MN25, whereby a potential of the node N51 is dropped When the potential of the node N11 reaches a threshold voltage of the invertor 13, the rising edge appears on the clock signal SP11 from the invertor 11. It is assumed that that a charge CV is accumulated at the common node N11 when the voltage of the node N11 reaches the threshold voltage of the invertor 13. The input clock signal Q3 is high level, a charge drawing current is 2NI. The necessary time for drawing the charge CV from the common node N11 after the rise-edge appears on the clock signal Q1 is given by:

$$2tCK+(CV-2tCK\cdot aI)/2NI=CV/2NI+(1-a/2N)2tCK,$$

where 2tCK a time period from the rise-edge of the clock signal Q1 to the rise-edge of the clock signal Q3, and "a" is set at "1" for the timing difference divider $5a1$, and also set at "nmax" for the timing difference divider 5anmax. The clock signals S11 - - - S1nmax differ from each other in rise-timing by tCK/n. The rise-timings of the clock signals S11 - - - S1nmax are defined by the fact that the clock reset signal SP1R is fallen and the common node N11 is pre-charged up to the high level.

The rise-timing of the clock reset signal SP1R is defined by the fact that the charge of the node N31 is drawn through the n-channel MOS field effect transistors MN31 - - - MN45 so that the potential of the common node N31 reaches the threshold voltage of the invertor 13 and thus the rise-edge appears on the output signal from the invertor 13. The reset signal generation circuit is equal in circuit configuration to the timing difference divider $5a1$. Assuming that a charge CV should be drawn to have the potential of the common node N31 to correspond to the threshold voltage of the invertor 13, if the clock signal Q3 is high level, then the charge drawing current is 2NI which is proportional to the gate width of the above transistor. The rise-timing of the clock reset signal SP1R is caused by the fact that the clock signal Q3 is risen to draw the charge CV from the node N31 at the current 2NI. For this reason, the time necessary for drawing the charge CV from the node N31 after the rise-edge has appeared on the clock signal Q1 is given by 2tCK+CV/2NI.

In order to cause that a difference in rise-timing of the clock signal S1nmax from the clock signal SP1L corresponds to tCK/n and also that the node N11 is pre-charged prior to the next operational cycle, it is required to satisfy both a condition that even if the charge of the node N11 is drawn at the current NI during the period 2CKn, then the potential of the node N11 does not reach the threshold voltage of the invertor 13 and also another condition that if the charge of the node N11 is drawn at the current 2NI during the period 2tCKn, then the potential of the node N11 reaches the threshold voltage of the invertor 13. The following conditions should be satisfied.

$$CV-2tCK \cdot NI>0 \text{ and } CV-2tCK-2NI<0$$

However, the period tCK of the external clock signal 1 has not been determined on design of the circuit and the drawing current I is variable depending upon the device performances and characteristics. For those reasons, the value CV is varied in consideration of the period of the external clock signal and the device performances and characteristics.

The series connections of the n-channel MOS field effect transistors and the capacitors serve as loads to the common node. Since the n-channel MOS field effect transistors exhibit switching operations in accordance with the control signal. Further, three sets of the n-channel MOS field effect transistors and the capacitors have size ratios 1:2:4 in gate width and capacitance. For those reasons, the loads to the common node are controlled by the control signals at eight levels.

The control signal corresponds to the counted value obtained from the counter by counting the number of oscillation of the ring-oscillator during the period of the external clock signal. In accordance with the present circuit configuration, a relationship between the period of the external clock signal and the period of the ring-oscillator is coded, for which not only the reason operable range to the period of the external clock signal is increased but also the device performance and characteristic are not varied.

In accordance with the present invention, the external clock signal is divided into four phase clock signals to generate the multiplied clock signals without use of feedback circuits such as PLL or DLL.

SECOND EMBODIMENT

A second embodiment according to the present invention will be described in detail with reference to the drawings. The novel clock signal multiplier circuit of the second embodiment in accordance with the present invention will be described in detail with reference to FIG. 13, wherein an external clock signal 1 is divided into four different phase clock signals for subsequent synthesizing the two different phase clock signals to obtain a multiplied clock signal A ¼ divider 2 is operated to divide the external clock signal 1 into four different phase clock signals Q1, Q2, Q3 and Q4. A four-phase clock signal multiplier circuit 5 is connected between the ¼ divider 2 and a clock signal synthesizer circuit 8 for n-dividing differences in input timing of the pulse edges with n-different phases of the multi-phase clock signals divided by the divider 2. The four-phase clock signal multiplier circuit 5 conducts a n-times multiplication of the four different phase clock signals Q1, Q2, Q3 and Q4 to generate n-times multiplied different phase clock signals S1, S2, S3, S4 - - - Snmax. The clock signal synthesizer circuit 8 receives the n-times multiplied different phase signals S1, S2, S3, S4 - - - Snmax and synthesizes the n-times multiplied different phase clock signals S1, S2, S3, S4 - - - Snmax into a single multiplied clock signal 9b.

Further, a period detection circuit 6 is provided for receiving the external clock signal 1 to generate a control signal 7 to be supplied to the four-phase clock signal multiplier circuit 5 so as to compensate clock signal period dependency of the timing difference dividers included in the four-phase clock signal multiplier circuit 5. The period detection circuit 6 of this embodiment has a predetermined number of stages on each of which a ring-oscillator and a counter are provided, so that the counter is operated to count the number of oscillations of the ring oscillator during one period of the external clock signal 1 for generating the control signal 7 on the basis of the counted number. As a result, the control signal 7 from the period detection circuit 6 settles a problem with variation in characteristics of the four-phase clock signal multiplier circuit 5.

As a modification to the period detection circuit 6, the period detection circuit 6 may comprise invertors and latch circuits which have a cascade connection.

Further, a multiplying number determination code 12 is externally inputted into the four-phase clock signal multiplier circuit 5 in order to determine the maximum number of the clock signals to be synthesized by the clock signal synthesizer 8 and allow the remaining clock signals to be removed by the clock signal synthesizer 8.

Figure 13:
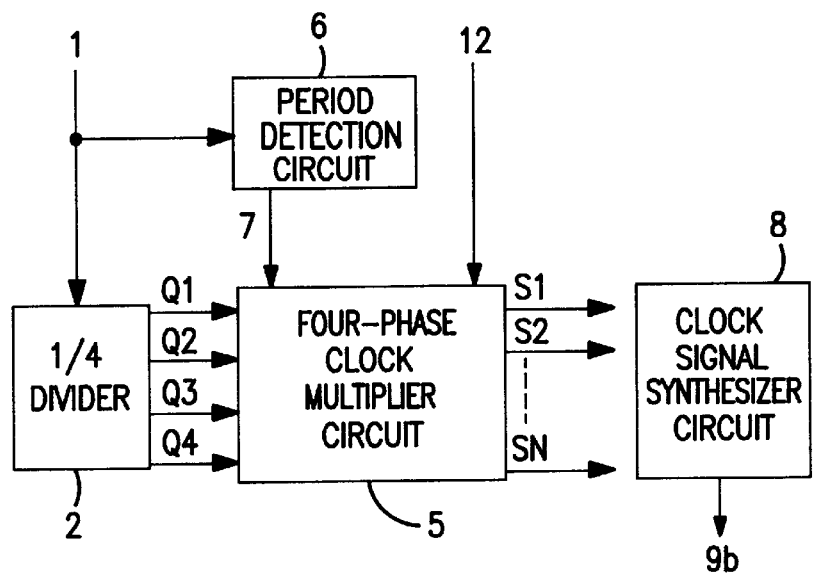
FIG. 13 is a schematic block diagram illustrative of a novel clock signal control circuit using a ¼ divider in a second embodiment in accordance with the present invention.
Figure 14:
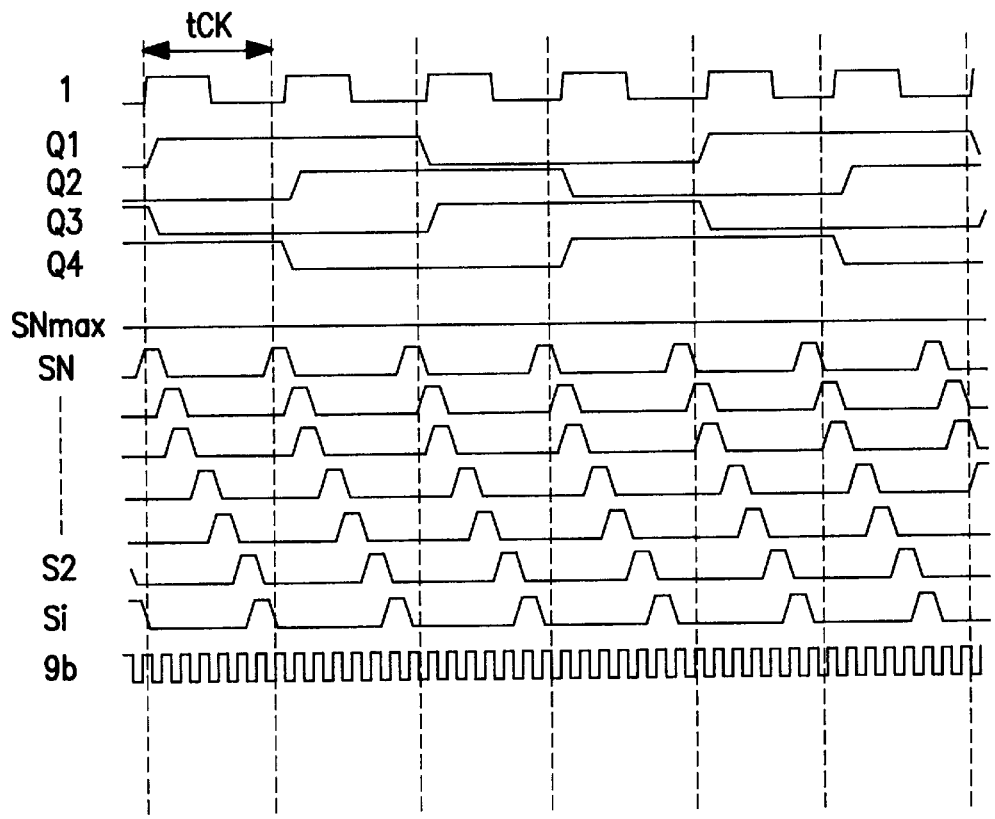
FIG. 14 is a timing chart illustrative of waveforms of the four-phase clock signals and a multiplied clock signal in relation to the novel clock signal control circuit of FIG. 13.

FIG. 14 is a timing chart illustrative of waveforms of the four-phase clock signals and a multiplied clock signal in relation to the novel clock signal control circuit of FIG. 13. The external clock signal 1 is divided by the divider 2 into the four different phase clock signals Q1, Q2, Q3 and Q4. The four different phase clock signals Q1, Q2, Q3 and Q4 are multiplied by the four-phase clock signal multiplier circuit 5 to generate n-times multiplied different phase clock signals S1, S2, S3, S4 - - - Snmax. The four-phase clock signal multiplier circuit 5 receives a multiplying number determination code 12 so that if the multiplying number determination code 12 designates the number "n", then only the clock signals S1, S2, - - - Sn are used as n-phase clock signals within the period of tCK with a phase difference of tCK/n and then synthesized by the clock signal synthesizer 8 to generate the multiplied clock signal 9b, whilst the remaining clock signals Sn+1 - - - Snmax are removed by the clock signal synthesizer 8. "nmax" indicates the maximum value by which the four-phase clock signals Q1, Q2, Q3 and Q4 are multiplied by the four-phase clock signal multiplier circuit 5. In this embodiment, "nmax" is set to be 8.

Figure 15:
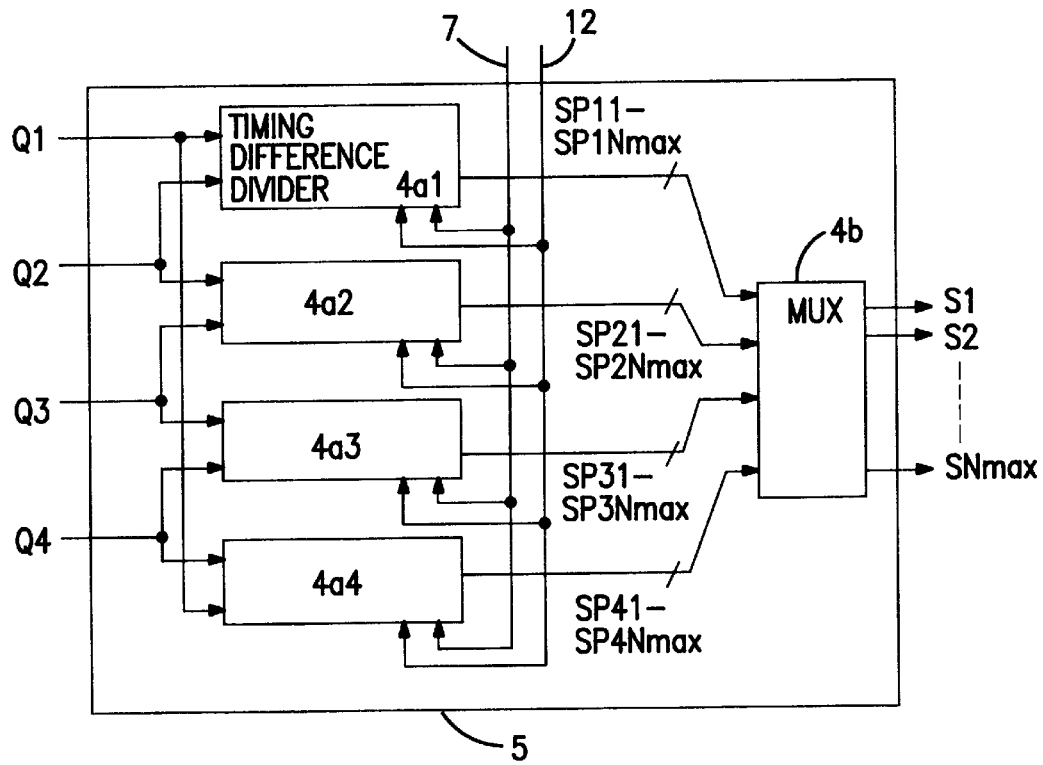
FIG. 15 is a schematic block diagram illustrative of each of the individual four-phase clock signal multiplier circuits in FIG. 13.

FIG. 15 is a schematic block diagram illustrative of each of the individual four-phase clock signal multiplier circuits in FIG. 13. The individual four-phase clock signal multiplier circuit of FIG. 15 is to be used in case of ¼ division=4, namely in case when a single four-phase clock signal multiplier circuit is connected in series between the ¼ divider and the multiplexer. The four-phase clock signal multiplier circuit 5 has four timing difference dividers 4a1, 4a2, 4a3 and 4a4 connected in parallel to each other and a single multiplexer circuit 4b. The multiplexer circuit 4b is connected to the four-phase clock signal multiplier circuit 5. Each of the four timing difference dividers 4a1, 4a2, 4a3 and 4a4 receives the control signal 7 and the multiplying number determination code 12. The timing difference divider 4a1 receives clock signals Q1 and Q3 to generate clock signals SP11 - - - SP1nmax. The timing difference divider 4a2 receives clock signals Q2 and Q4 to generate clock signals SP21 - - - SP2nmax. The timing difference divider 4a3 receives clock signals Q3 and Q1 to generate clock signals SP31 - - - SP3nmax. The timing difference divider 4a4 receives clock signals Q4 and Q2 to generate clock signals SP41 - - - SP4nmax. The multiplexer circuit 4b receives the clock signals SP11 - - - SP1nmax from the timing difference divider 4a1. The multiplexer circuit 4b also receives the clock signals SP21 - - - SP2nmax from the timing difference divider 4a2. The multiplexer circuit 4b also receives the clock signals SP31 - - - SP3nmax from the timing difference divider 4a3. The multiplexer circuit 4b also receives the clock signals SP41 - - - SP4nmax from the timing difference divider 4a4. The clock signals SP11 - - -SP1nmax, the clock signals SP21 - - - SP2nmax, the clock signals SP31 - - - SP3nmax and the clock signals SP41 - - - SP4nmax are inputted into the single multiplexer 4b and then multiplexed thereby to generate nmax sets of the clock signals S1, S2, - - - Snmax. The clock signals S1, S2, - - - Snmax are inputted into the clock signal synthesizer 8. The multiplying number determination code 12 is inputted into the four timing difference dividers 4a1, 4a2, 4a3 and 4a4. If the multiplying number determination code 12 designates the number "n", then only the clock signals clock signals S1, S2, - - - Sn are used as n-phase clock signals within the period of tCK with a phase difference of tCK/n and then synthesized by the clock signal synthesizer 8 to generate the multiplied clock signal 9b, whilst the remaining clock signals clock signals Sn+1, - - - Snmax are removed by the clock signal synthesizer 8.

Figure 16:
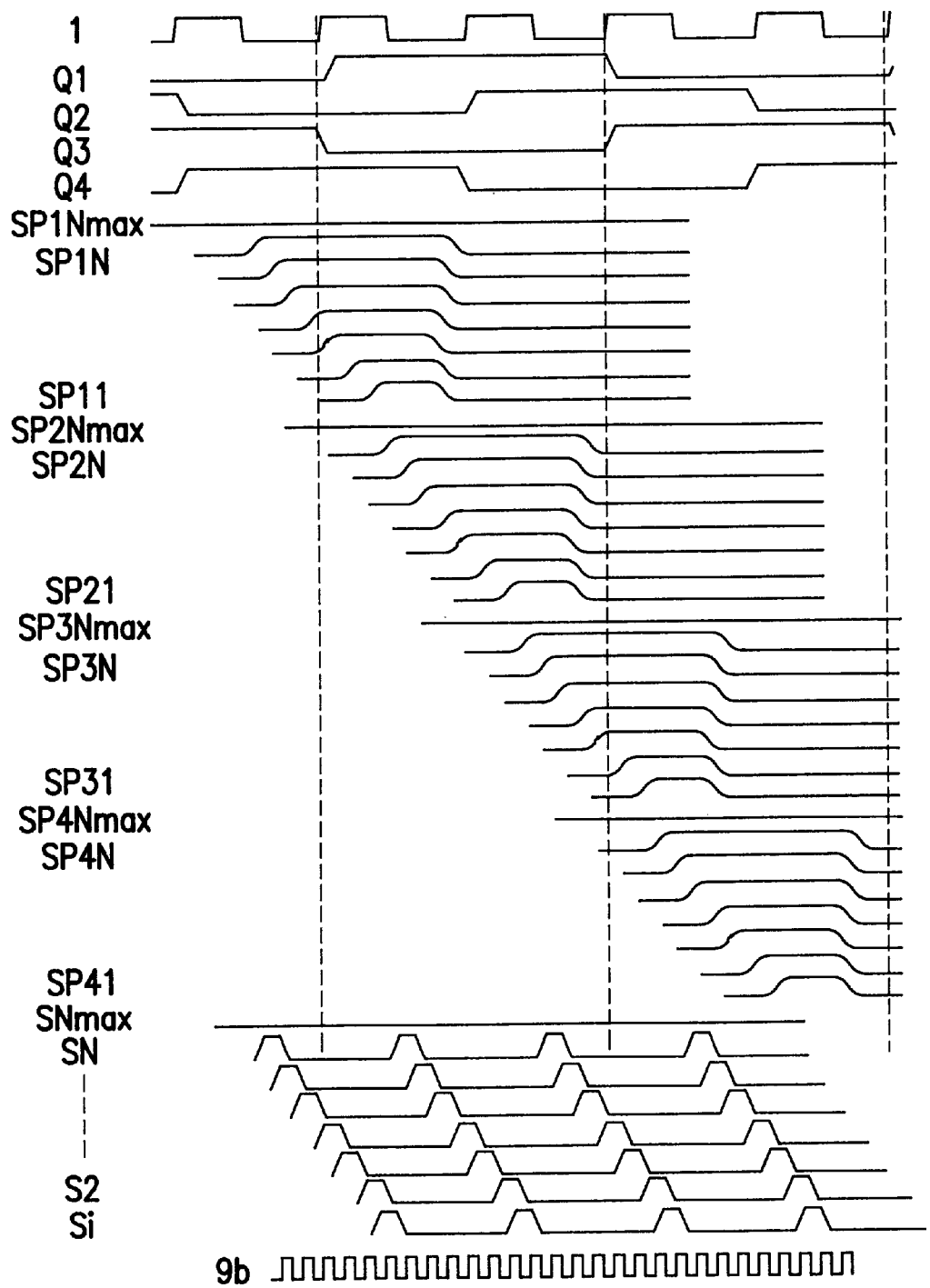
FIG. 16 is a timing chart illustrative of waveforms of the four-phase clock signals and a multiplied clock signal in relation to the clock signal multiplier circuit in FIG. 15.

FIG. 16 is a timing chart illustrative of waveforms of the four-phase clock signals and a multiplied clock signal in relation to the clock signal multiplier circuit in FIG. 15. The external clock signal 1 is divided by the ¼ divider 2 into four-phase clock signals Q1, Q2, Q3 and Q4. The lock signals Q1 and Q3 are inputted into the timing difference divider 4a1 to generate clock signals SP11 - - - SP1nmax. The clock signals Q2 and Q4 are inputted into the timing difference divider 4a2 to generate clock signals SP21 - - - SP2nmax. The clock signals Q3 and Q1 are inputted into the timing difference divider 4a3 to generate clock signals SP31 - - - SP3nmax. The clock signals Q4 and Q2 are inputted into the timing difference divider 4a4 to generate clock signals SP41- - - SP4nmax. The clock signals SP11 - - - SP1nmax, SP21 - - - SP2nma, SP31 - - - SP3nmax, and SP41 - - - SP4nmax are inputted into the multiplexer circuit 4b to generate "nmax" sets of the clock signals S1, S2, - - - Snmax. The clock signals S1, S2, - - - Snmax are inputted into the clock signal synthesizer 8. The multiplying number determination code 12 has also been inputted into the four timing difference dividers 4a1, 4a2, 4a3 and 4a4. If the multiplying number determination code 12 designates the number "n", then only the clock signals clock signals S1, S2, - - - Sn are used as n-phase clock signals within the period of tCK with a phase difference of tCK/n and then synthesized by the clock signal synthesizer 8 to generate the multiplied clock signal 9b, whilst the remaining clock signals clock signals Sn+1, - - - Snmax are removed by the clock signal synthesizer 8.

Figure 17:
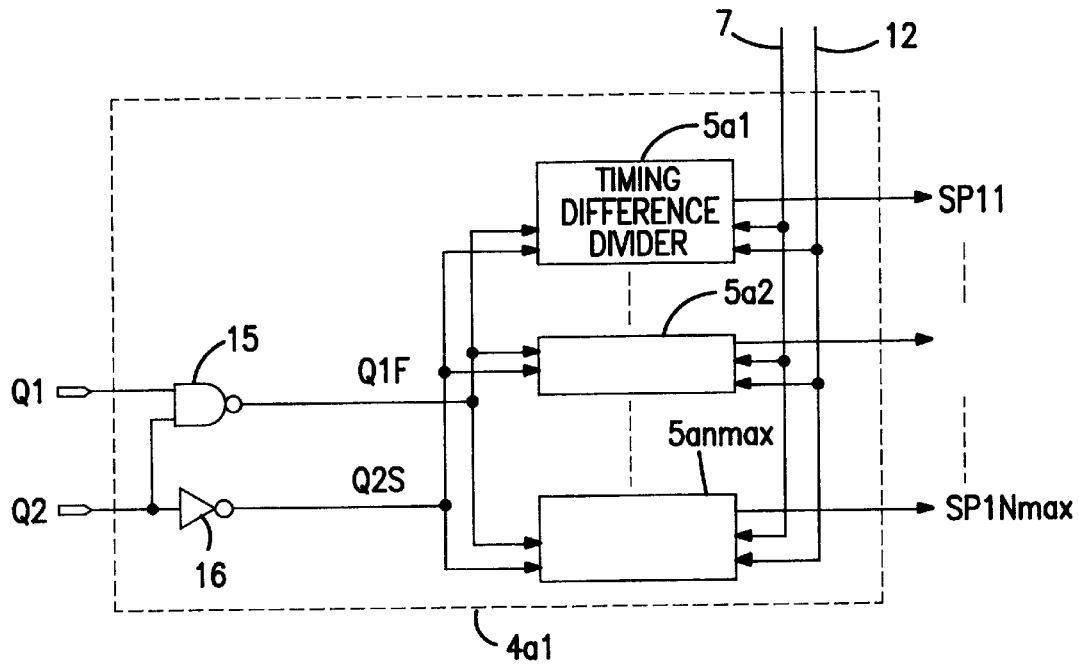
FIG. 17 is a circuit diagram illustrative of the timing difference divider 4a1 in the four-phase clock signal multiplier circuit of FIG. 15.

FIG. 17 is a circuit diagram illustrative of the timing difference divider 4a1 in the four-phase clock signal multiplier circuit of FIG. 15. The timing difference divider 4a1 comprises timing difference dividers 5a1, 5a2, 5a3, 5a4 - - - 5a"nmax" and logic gate circuits of a single two-input NAND gate 15 and an invertor 16. The invertor 16 receives the clock signal Q2 to output a clock signal Q2S. The two-input NAND gate 15 receives the clock signals Q1 and Q2 to output a clock signal Q1F. The timing difference dividers 5a1, 5a2, 5a3, 5a4 - - - 5a"nmax" are connected in parallel to each other between the logic gate circuit and the multiplexer 8. The control signal 7 and the multiplying number determination code 12 are inputted into each of the timing difference dividers 5a1, 5a2, 5a3, 5a4 - - - 5a"nmax". The clock signal Q1F from the two-input NAND gate 15 is inputted into each of the timing difference dividers 5a1, 5a2, 5a3, 5a4 - - - 5a"nmax". The clock signal Q2S from the invertor 16 is also inputted into each of the timing difference dividers 5a1, 5a2, 5a3, 5a4 - - - 5a"nmax".

Figure 18:
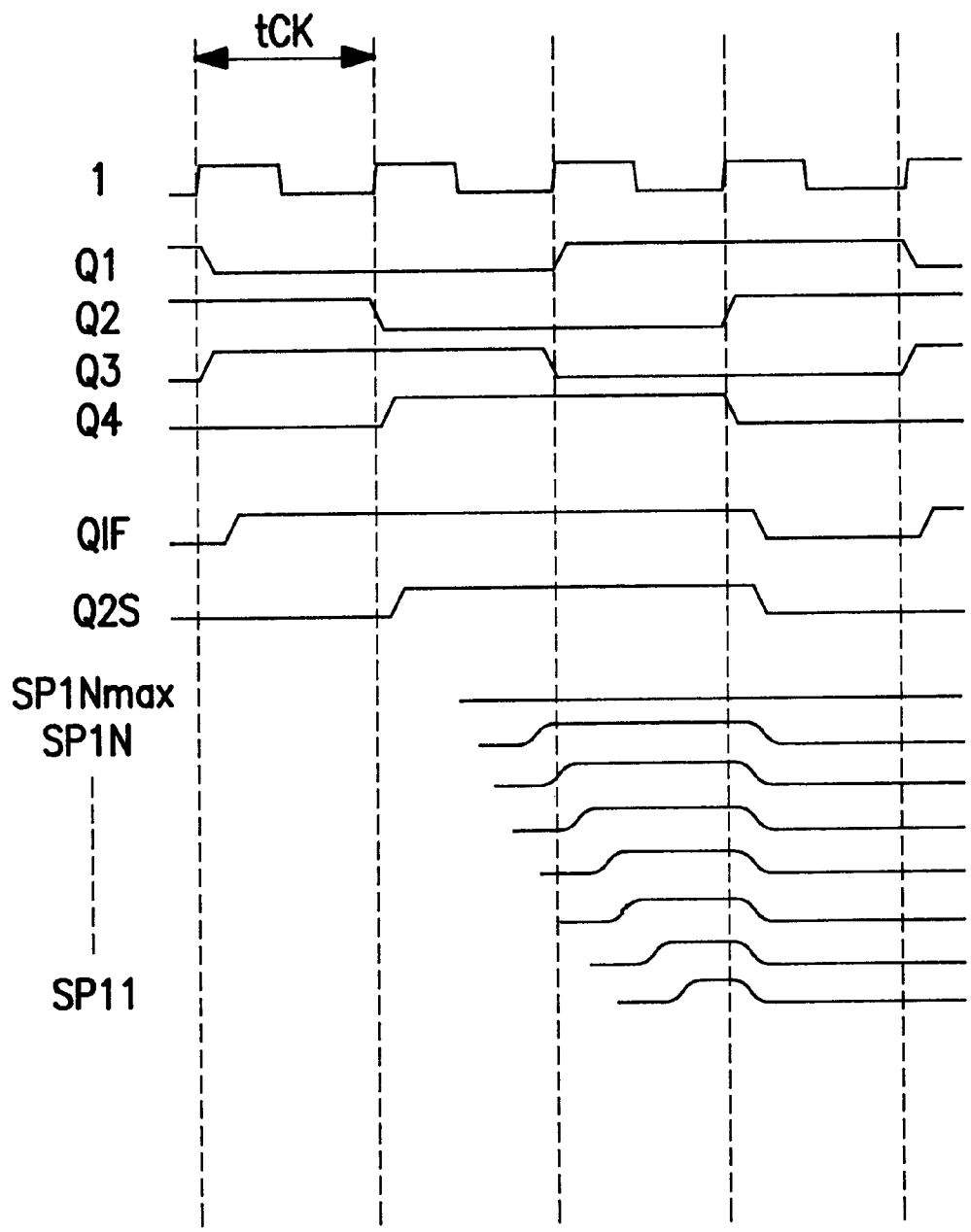
FIG. 18 is a timing chart illustrative of waveforms of the clock signals of the timing difference divider 4a1 of FIG. 17.

FIG. 18 is a timing chart illustrative of waveforms of the clock signals of the timing difference divides 4a1 of FIG. 17.

The descriptions will be described in case of "n"=7 and "nmax"=8. The multiplying number determination code designates "n"=7. The clock signals Q1 and Q2 are inputted into the NAND gate 15 to generate the clock signal Q1F of a period 3tCK. The clock signal Q2 is inputted into the invertor 16 to generate the lock signal Q2S with a pulse width of 2tCK. The clock signals SP11 - - - SP17 differ in rising edge timing from each other by tCK/7. The rising edges appear on the clock signals SP11 - - - SP17 with phase difference corresponding to tCK/7. When the falling appears on the reset signal S1R, then the clock signals SP11 - - - SP17 are fallen. The clock signals SP17, SP16, SP15, SP14, SP13, SP12 and SP11 are sequentially outputted. The falling of the clock reset signal S1R appears about tCK/7 after the clock signal SP11 has been risen. On the other hands, the clock signal SP18 is fixed at low level by the clock signal synthesizer circuit 8 using the normal decoder circuit.

Figure 19:
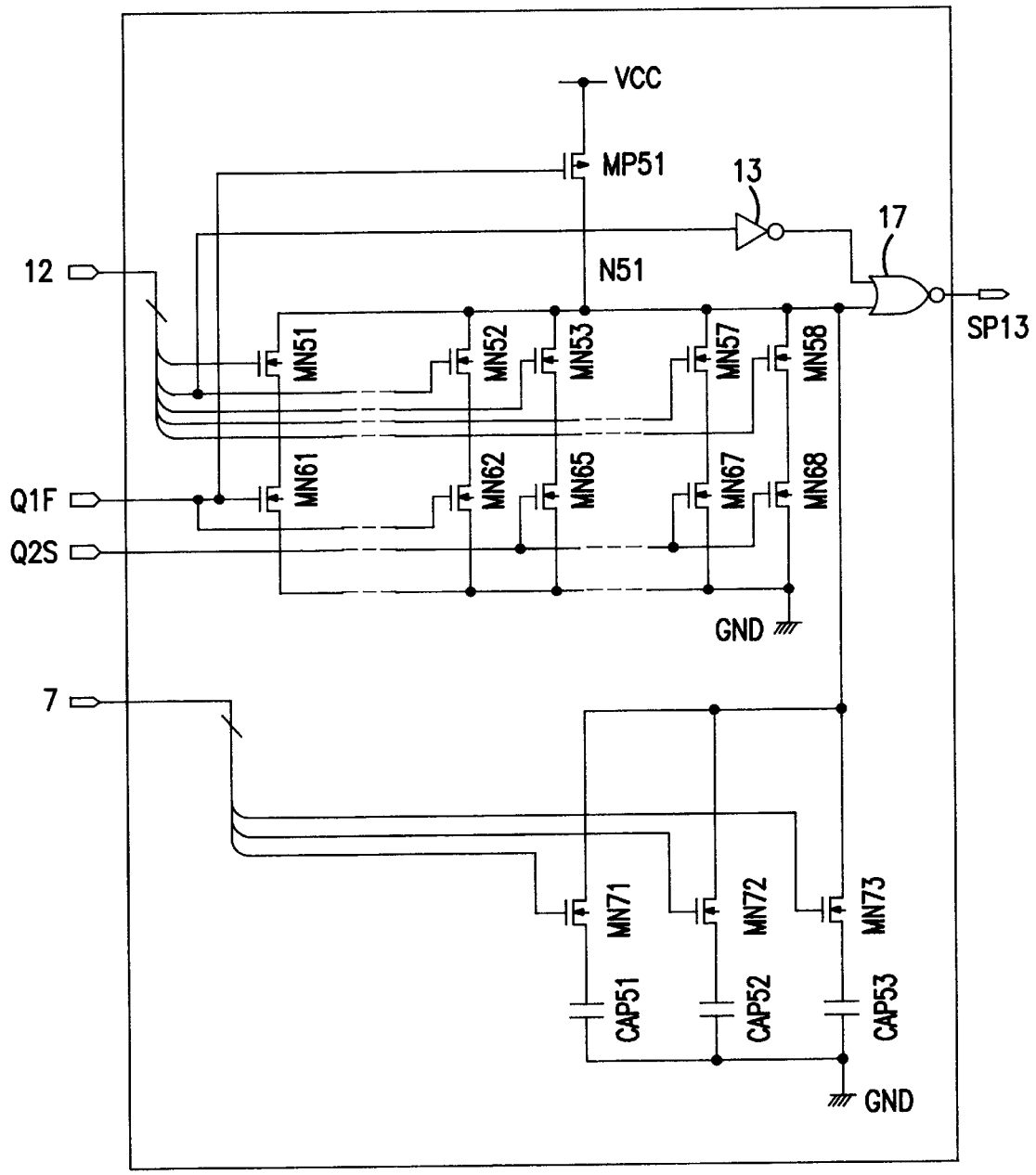
FIG. 19 is a circuit diagram illustrative of the timing difference divider 5a1 in the timing difference divider 4a1 of FIG. 17.

FIG. 19 is a circuit diagram illustrative of the timing difference divider 5a1 in the timing difference divider 5a1 of FIG. 17. The timing difference dividers 5a1 - - - 5a"nmax" have the same elements, for example, a single NOR gate 17, a single invertor 18, a single p-channel MOS field effect transistor MP51, a first set of two n-channel MOS field effect transistors MN51 and MN61 connected in series to each other, a second set of two n-channel MOS field effect transistors MN53 and MN63 connected in series to each other, a third set of two n-channel MOS field effect transistors MN54 and MN64 connected in series to each other, a fourth set of three n-channel MOS field effect transistors MN57 and MN67 connected in series to each other, a fifth set of three n-channel MOS field effect transistors MN58 and MN68 connected in series to each other, a sixth set of an n-channel MOS field effect transistor MN71 and a capacitor CAP51 connected in series to each other, a seventh set of an n-channel MOS field effect transistor MN72 and a capacitor CAP52 connected in series to each other, and an eight set of an n-channel MOS field effect transistor MN73 and a capacitor CAP53 connected in series to each other.

The single invertor 18 receives the multiplying number determination code 12 to output an inverted signal. The NOR gate 17 has two inputs connected to the output of the invertor for receiving the inverted signal and also to a common node N51 to generate a clock signal SP13. The p-channel MOS field effect transistor MP51 is connected in series between a high voltage line VCC and the common node N51. A first series connection of the two n-channel MOS field effect transistors MN51 and MN61 is connected between the common node N51 and a ground line GND. A second series connection of the three n-channel MOS field effect transistors MN52 and MN62 is also connected between the common node N51 and the ground line GND. A third series connection of the three n-channel MOS field effect transistors MN54 and MN64 is also connected between the common node N51 and the ground line GND. A fourth series connection of the two n-channel MOS field effect transistors MN57 and MN67 is also connected between the common node N51 and the ground line GND. A fifth series connection of the two n-channel MOS field effect transistors MN58 and MN68 is also connected between the common node N51 and the ground line GND. A sixth series connection of the n-channel MOS field effect transistor MN71 and the capacitor CAP51 is connected between the common node N51 and the ground line GND. A seventh series connection of the n-channel MOS field effect transistor MN72 and the capacitor CAP52 is also connected between the common node N51 and the ground line GND. An eight series connection of the n-channel MOS field effect transistor MN73 and the capacitor CAP53 is also connected between the common node N51 and the ground line GND. A gate of the p-channel MOS field effect transistor MP51 receives the clock signal Q1F. Gates of the n-channel MOS field effect transistors MN51, MN53, MN54, MN57, and MN58 receive the multiplying number determination code 12. Gates of the n-channel MOS field effect transistors MN61 and MN62 receive the clock signal Q1F. Gates of the n-channel MOS field effect transistors MN64, MN67 and MN68 receive the clock signal Q2S. Gates of the n-channel MOS field effect transistors MN71, MN72 and MN73 receive the control signal 7 from the counter. Loads to the common node N51 comprises the sixth series connection of the n-channel MOS field effect transistor MN71 and the capacitor CAP51, the seventh series connection of the n-channel MOS field effect transistor MN72 and the capacitor CAP52, the eight series connection of the n-channel MOS field effect transistor MN73 and the capacitor CAP53. The n-channel MOS field effect transistors MN51, MN53, MN54, MN57 and MN58 have the size in gate width. The n-channel MOS field effect transistors MN61, MN63, MN64, MN67 and MN68 have the same size ratios in gate width. The sixth set of the n-channel MOS field effect transistor MN71 and the capacitor CAP51, the seventh set of the n-channel MOS field effect transistor MN72 and the capacitor CAP52, and the eighth set of the n-channel MOS field effect transistor MN73 and the capacitor 53 have size ratios in gate width and capacitance of 1:2:4.

The n-channel MOS field effect transistors MN71, MN72 and MN73 show ON/OFF switching operations in accordance with the control signal 7. Further, the sixth set of the n-channel MOS field effect transistor MN71 and the capacitor CAP51, the seventh set of the n-channel MOS field effect transistor MN72 and the capacitor CAP52, and the eighth set of the n-channel MOS field effect transistor MN73 and the capacitor CAP53 have size ratios in gate width and capacitance of 1: 2 : 4. For those reasons, the loads to the common node N51 is varied at eight levels in accordance with the control signal 7.

Figure 20:
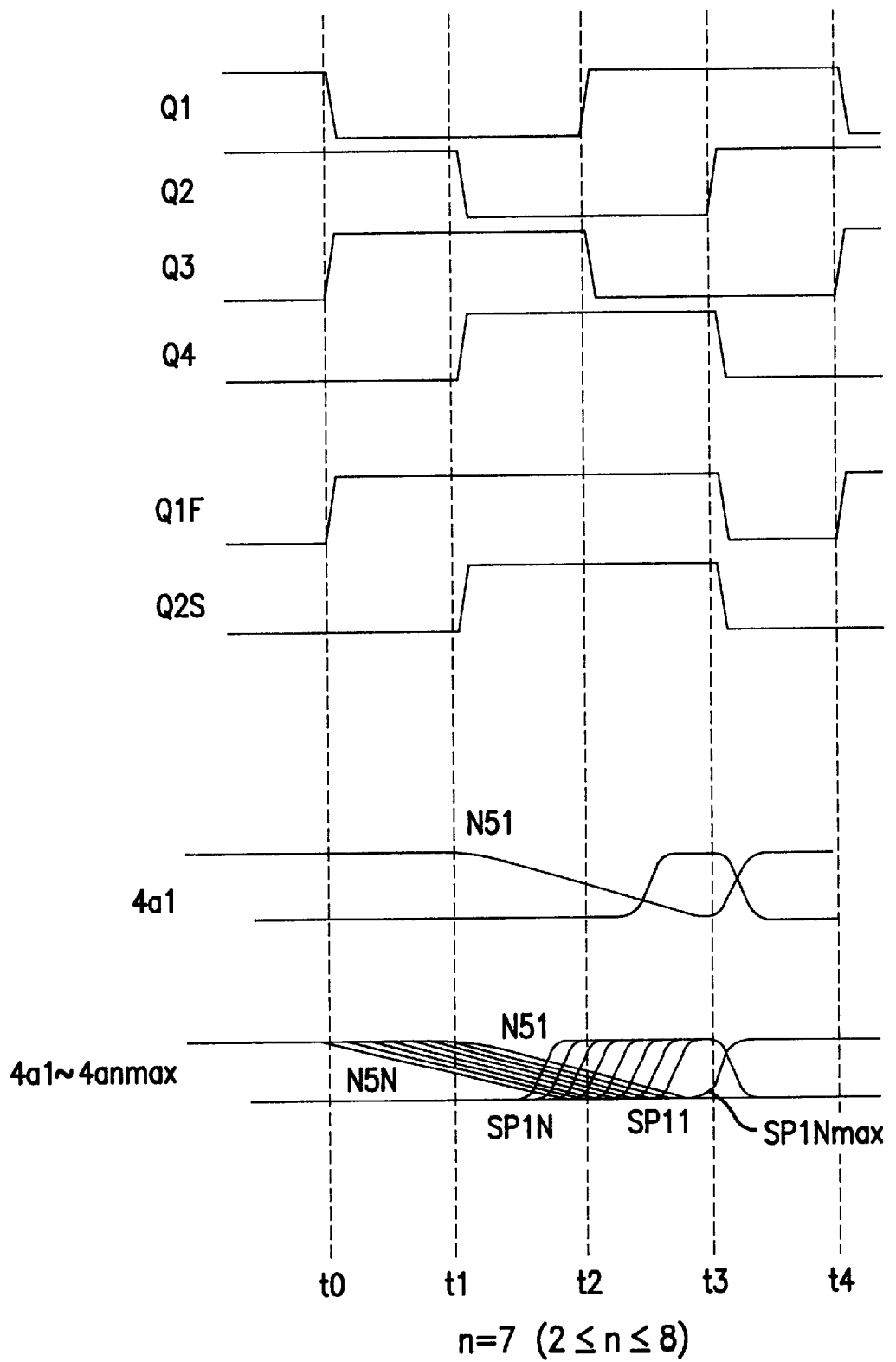
FIG. 20 which is a timing chart illustrative of waveforms of signals at the nodes of the timing difference dividers of FIG. 19.

Operations of the timing difference dividers 5a1 - - - 5a"nmax" will subsequently be described with reference to FIG. 20 which is a timing chart illustrative of waveforms of signals at the node of the timing difference divider of FIG. 19.

The waveforms of the signals at the common node N51 of the timing difference divider 5a1 of FIG. 19 have a period ranged from t0 to t4, or 4tCK. The description will focus on rising of the clock signal at the common node N11. The rise-timing of the clock signal SP11 from the timing difference divider 5a1 will be described. When any one of the n-channel MOS field effect transistors MN51 - - - MN68 turns ON, the charge at the node N51 is drawn through the selected ones of the n-channel MOS field effect transistors MN51 - - - MN68, whereby a potential of the node N51 is dropped. When the potential of the node N51 reaches a threshold voltage of the invertor 13, the rising edge appears on the clock signal SP11 from the invertor 13. It is assumed that that a charge CV is accumulated at the common node N51 when the voltage of the node N51 reaches the threshold voltage of the invertor 13. If the input clock signal Q1F is high level, a charge drawing current of the timing difference divider 4ah (h=1to "nmax") is hI. Subsequently if the clock signal Q2S becomes high level, then an additional charge drawing current thereof is (n–h)I. The drawing current is proportional to the number of the driven transistors in ON-state. The necessary time for drawing the charge CV from the common node N51 after the rise-edge appears on the clock signal Q1 is given by:

tCK+(CV–tCK·hI)/NI=CV/NI+(1–h/N)tCK, where tCK a time period from the rise-edge of the clock signal Q1 to the rise-edge of the clock signal Q2, and "h" is set h=3 for the timing difference divider "ah". The clock signals SP11 - - - SP1nmax differ from each other in rise-timing by tCK/n.

The multiplying number determination code 12 is inputted through the invertor 18 to the NOR gate 17. If "h" is larger than the number "n" designated by the multiplying number determination code 12, then the clock signal is fixed at low level.

The rise-timings of the clock signals S11 - - - S1nmax are defined by the fact that the clock reset signal Q1F is fallen and the common node N51 is pre-charged up to the high level.

In order to cause that a difference in rise-timing of the clock signal S1nmax from the clock signal SP11 corresponds to tCK/n and also that the node N51 is pre-charged prior to the next operational cycle, it is required to satisfy both a condition that even if the charge of the node Nil is drawn at the current NI during the period tCKn, then the potential of the node N11 does not reach the threshold voltage of the invertor 13 and also another condition that if the charge of the node N51 is drawn at the current NI during the period 2tCKn, then the potential of the node N11 reaches the threshold voltage of the invertor 13. The following conditions should be satisfied.

$CV-tCK·(N-1)I>0$ and $CV-2tCK-NI<0$

The series connections of the n-channel MOS field effect transistors and the capacitors serve as loads to the common node. Since the n-channel MOS field effect transistors exhibit switching operations in accordance with the control signal. Further, three sets of the n-channel MOS field effect transistors and the capacitors have size ratios 1:2:4 in gate width and capacitance. For those reasons, the loads to the common node are controlled by the control signals at eight levels.

In accordance with the present invention, the external clock signal is divided into four phase clock signals to generate the multiplied clock signals without use of feedback circuits such as PLL or DLL.

The above novel circuitry is applicable to the variable delay circuit capable of dividing timing differences between two-input clock signals by inputting clock pulse signals with a constant timing difference from each other.

In accordance with the present invention, the external clock signal is divided into multi-phase clock signals to take an intermediate timing between the different phase clock signals in order to generate multiplied clock signals without use of the looped circuit configuration. For this reason, it is possible to shorten the time necessary to obtain the multiplied clock signal. Further, it is possible to predict the necessary clock number, for which reason it is possible to shorten remarkably the waiting time for use of the multiplied clock signals.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multiple phase clock signal multiplier comprising:
   four timing difference dividers connected in parallel to each other for dividing multiple phase clock signals having different phases from each other to generate different phase clock signals; and a single multiplexer connected to all of said four timing difference dividers for multiplexing all said different phase clock signals to generate multiplexed clock signals.

2. The multiplier of claim 1, further comprising
a divider connected to said four timing difference dividers for dividing an external clock signal into the multiple phase clock signals and
a synthesizer connected to said single multiplexer for synthesizing said multiplexed clock signals into a single multiplied clock signal.

3. The multiplier of claim 1, wherein said divider comprises a ¼ divider and wherein each of said four timing difference dividers comprises four further timing difference dividers connected in parallel to each other and each of said four further timing difference dividers is capable of generating a plurality of the different phase clock signals.

4. The multiple phase clock signal multiplier as claimed in claim 1, wherein each of said four timing difference dividers comprises a plurality of further timing difference dividers connected in parallel to each other and a single clock reset signal generator connected in parallel to said further timing difference dividers and also connected to transmit a reset signal to each of said further timing difference dividers so that individual ones of said further timing difference dividers output said different phase clock signals respectively.

5. The multiple phase clock signal multiplier as claimed in claim 1, wherein said four timing difference dividers are connected to a period detection circuit for receiving a control signal from said period detection circuit.

6. The multiple phase clock signal multiplier as claimed in claim 1, wherein said four timing difference dividers and said single multiplexer form a single multiple phase clock signal multiplier circuit.

7. The multiple phase clock signal multiplier as claimed in claim 1, wherein said four timing difference dividers each include MOS field effect transistors and capacitors and said four timing difference dividers are different from each other in gate width of said MOS field effect transistors and in capacitance of said capacitors.

8. A clock signal control circuit comprising
at least one of the multiple phase clock signal multiplier of claim 1.

9. The clock signal control circuit as claimed in claim 8, comprising a plurality of the at least one multiple phase clock signal multiplier.

10. The clock signal control circuit as claimed in claim 8, wherein each of said four timing difference dividers comprises a plurality of further timing difference dividers connected in parallel to each other and a single clock reset signal generator connected in parallel to said further timing difference dividers and also connected to transmit a reset signal to each of said further difference dividers so that individual ones of said further timing difference dividers output said different phase clock signals respectively.

11. The clock signal control circuit as claimed in claim 8, wherein said four timing difference dividers are connected to a period detection circuit for receiving a control signal from said period detection circuit.

12. The clock signal control circuit as claimed in claim 8, wherein each of said four timing difference dividers in each said multiple phase clock signal multiplier circuit includes MOS field effect transistors and capacitors and said four timing difference dividers are different from each other in gate width of said MOS field effect transistors and in capacitance of said capacitors.

13. A multiple phase clock signal multiplier comprising:
a plurality of timing difference dividers for dividing phase clock signals having different phases from each other to generate different phase clock signals;
a single multiplexer connected to all of said timing difference dividers for multiplexing said different phase clock signals to generate multiplexed clock signals; and
a period detection circuit connected to said timing difference dividers for providing a control signal to said timing difference dividers.

14. The multiplier of claim 13, further comprising a divider connected to said timing difference dividers for dividing an external clock signal into the multiple phase clock signals, and a synthesizer connected to said single multiplexer for synthesizing said multiplexed clock signals into a single multiplied clock signal.

15. The multiplier of claim 14, wherein said divider comprises a ¼ divider and wherein each of said timing difference dividers comprises four further timing difference dividers connected in parallel to each other and each of said four further timing difference dividers is capable of generating a plurality of the different phase clock signals.

16. The multiplier of claim 13, wherein each of said timing difference dividers comprises a plurality of further timing difference dividers connected in parallel to each other and a single clock reset signal generator connected in parallel to said further timing difference dividers and also connected to transmit a reset signal to each of said further timing difference dividers so that individual ones of said further timing difference dividers output different phase clock signals respectively.

17. A multiple phase clock signal multiplier comprising:
a plurality of timing difference dividers for dividing multiple phase clock signals having different phases from each other to generate different phase clock signals;
a single multiplexer connected to all of said timing difference dividers for multiplexing said different phase clock signals to generate multiplexed clock signals; and
each of said timing difference dividers comprising a plurality of further timing difference dividers connected in parallel to each other and a single clock reset generator connected in parallel to said further timing difference dividers and also connected to transmit a reset signal to each of said further timing difference dividers so that individual ones of said further timing difference dividers output said different phase clock signals respectively.

18. The multiplier of claim 17, further comprising a divider connected to said timing difference dividers for dividing an external clock signal into the multiple phase clock signals, and a synthesizer connected to said single multiplexer for synthesizing said multiplexed clock signals into a single multiplied clock signal.

19. The multiplier of claim 18, wherein said divider comprises a ¼ divider and wherein each of said timing difference dividers comprises four further timing difference dividers connected in parallel to each other and each of said four further timing difference dividers is capable of generating a plurality of the different phase clock signals.

20. The multiplier of claim 17, wherein said timing difference dividers are connected to a period detection circuit for receiving a control signal from said period detection circuit.

* * * * *